(12) United States Patent
Fukushima et al.

(10) Patent No.: US 8,446,792 B2
(45) Date of Patent: May 21, 2013

(54) SEMICONDUCTOR INTEGRATED CIRCUIT

(75) Inventors: Yoshifumi Fukushima, Kyoto (JP);
Shoji Sakamoto, Kyoto (JP); Hiroyuki Sadakata, Osaka (JP); Kiyoto Ohta, Osaka (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 13/168,515

(22) Filed: Jun. 24, 2011

(65) Prior Publication Data
US 2011/0255353 A1 Oct. 20, 2011

Related U.S. Application Data

(63) Continuation of application No. PCT/JP2009/006809, filed on Dec. 11, 2009.

(30) Foreign Application Priority Data

Dec. 25, 2008 (JP) ................................. 2008-331204

(51) Int. Cl.
*G11C 7/04* (2006.01)
(52) U.S. Cl.
USPC .......................................... 365/211; 365/154

(58) Field of Classification Search
CPC .......................................................... G11C 7/04
USPC .......................................... 365/211, 154, 201
See application file for complete search history.

(56) References Cited

U.S. PATENT DOCUMENTS

| 7,103,495 | B2 | 9/2006 | Kiryu | |
| 2003/0103368 | A1 | 6/2003 | Arimoto et al. | |
| 2004/0136230 | A1 | 7/2004 | Noda et al. | |
| 2007/0234167 | A1 | 10/2007 | Momii | |
| 2008/0247079 | A1* | 10/2008 | Satoh et al. | 360/75 |

FOREIGN PATENT DOCUMENTS

| JP | 10-125056 | 5/1998 |
| JP | 10-325761 | 12/1998 |
| JP | 2001-68634 | 3/2001 |
| JP | 2001-091570 | 4/2001 |
| JP | 2002-170386 | 6/2002 |
| JP | 2006-84472 | 3/2006 |
| JP | 2007-240263 | 9/2007 |
| JP | 2007-256264 | 10/2007 |

* cited by examiner

*Primary Examiner* — Vu Le
(74) *Attorney, Agent, or Firm* — McDermott Will & Emery LLP

(57) ABSTRACT

A temperature sensing circuit activates a sensing signal when sensing that a temperature inside a semiconductor integrated circuit is lower than a predetermined temperature. A heat generation control circuit activates a heat generation control signal when the sensing signal is activated. When the heat generation control signal is activated, a current is generated inside a memory circuit to raise the temperature inside the semiconductor integrated circuit.

15 Claims, 22 Drawing Sheets

SEMICONDUCTOR INTEGRATED CIRCUIT

CROSS-REFERENCE TO RELATED APPLICATION

This is a continuation of PCT International Application PCT/JP2009/006809 filed on Dec. 11, 2009, which claims priority to Japanese Patent Application No. 2008-331204 filed on Dec. 25, 2008. The disclosures of these applications including the specifications, the drawings, and the claims are hereby incorporated by reference in their entirety.

BACKGROUND

The present disclosure relates to semiconductor integrated circuits having functions of sensing temperatures and generating heat.

In recent years, with diversification of target applications of semiconductor, the industry has focused on on-vehicle semiconductors. Electronic parts used for vehicles have dramatically increased, and semiconductor manufacturers are expecting the field of on-vehicle semiconductor devices. Accordingly, semiconductor devices are demanded to have fundamental capabilities such as QCD (quality, cost, delivery) more than technical innovation, and on-vehicle semiconductors need to have a wide range of an operating temperature to maintain high reliability. Thus, conventionally, overdesign is performed to secure a temperature margin, and testing for verifying design is performed at a high/low temperature to ensure a wide operating temperature range. Japanese Patent Publication No. 2007-240263 etc. shows a technique aimed at accurately testing an operation temperature.

Japanese Patent Publication No. 2007-240263 shows a semiconductor device in which an operation temperature is set high in an operation test to uniformly raise the temperature of a semiconductor chip to an upper limit of the operation temperature without raising the temperature of a tool for analysis to a heat-resistant temperature or more, even when the temperature of a semiconductor chip is higher than the heat-resistant temperature of the tool for analysis.

SUMMARY

However, Japanese Patent Publication No. 2007-240263 fails to consider operation security of the chip where an ambient temperature of the semiconductor device is low. That is, in order to reliably operate the chip even when the ambient temperature is low, attention such as performing overdesign in advance, or reducing a frequency to operate the chip after power-on and until the chip itself is heated should be paid. It is thus difficult to rapidly stabilize operation of a semiconductor device. In particular, where a semiconductor device is a reset state, the temperature of the semiconductor device cannot be rapidly raised, and it is thus difficult to rapidly stabilize the operation of the semiconductor device. For similar reasons, it is difficult to rapidly raise the temperature of a semiconductor device where a memory circuit included in the semiconductor device is in a standby state (where values of various signals supplied to the memory circuit are in a specific combination to inhibit the memory circuit to read and write information).

It is an objective of the present disclosure to provide a semiconductor integrated circuit rapidly stabilizing operation even at a low temperature.

According to an aspect of the present disclosure, a predetermined reset signal is supplied to a semiconductor integrated circuit after start of power supply. The semiconductor integrated circuit includes a memory circuit; a logic circuit configured to output a memory control signal controlling operation of the memory circuit; a temperature sensing circuit configured to activate a sensing signal when sensing that a temperature inside the semiconductor integrated circuit is lower than a predetermined temperature; and a heat generation control circuit configured to activate a heat generation control signal when the sensing signal is activated while the reset signal is supplied. A current is generated inside the memory circuit to raise the temperature inside the semiconductor integrated circuit when the heat generation control signal is activated.

In the semiconductor integrated circuit, the temperature of the semiconductor integrated circuit can be raised even when the memory circuit is in a reset state, thereby rapidly stabilizing operation of the semiconductor integrated circuit.

According to another aspect of the present disclosure, a semiconductor integrated circuit includes a memory circuit being changeable between a standby state and an operating state; a logic circuit configured to control a state of the memory circuit; a temperature sensing circuit configured to activate a sensing signal when sensing that a temperature inside the semiconductor integrated circuit is lower than a predetermined temperature; and a heat generation control circuit configured to activate a heat generation control signal when the sensing signal is activated while the logic circuit controls the memory circuit to the standby state. A current is generated inside the memory circuit to raise the temperature inside the semiconductor integrated circuit when the heat generation control signal is activated.

In the semiconductor integrated circuit, the temperature of the semiconductor integrated circuit can be raised even when the memory circuit is a standby state, thereby rapidly stabilizing operation of the semiconductor integrated circuit.

According to another aspect of the present disclosure, a predetermined reset signal is supplied to a semiconductor integrated circuit after start of power supply. The semiconductor integrated circuit includes a memory circuit being changeable between a standby state and an operating state; a logic circuit configured to control a state of the memory circuit; a temperature sensing circuit configured to activate a sensing signal when sensing that a temperature inside the semiconductor integrated circuit is lower than a predetermined temperature; and a heat generation control circuit configured to activate a heat generation control signal when the sensing signal is activated while the reset signal is supplied, or while the logic circuit controls the memory circuit to the standby state. A current is generated inside the memory circuit to raise the temperature inside the semiconductor integrated circuit when the heat generation control signal is activated.

In the semiconductor integrated circuit, where the memory circuit is both in a reset state and in a standby state, the temperature of the semiconductor integrated circuit can be raised, thereby rapidly stabilizing operation of the semiconductor integrated circuit.

According to another aspect of the present disclosure, a predetermined reset signal is supplied to a semiconductor integrated circuit after start of power supply. The semiconductor integrated circuit includes a memory circuit being changeable between a standby state and an operating state; a logic circuit configured to control a state of the memory circuit; and a temperature sensing circuit configured to activate a sensing signal when sensing that a temperature inside the semiconductor integrated circuit is lower than a predetermined temperature. An operating current increases when the sensing signal is activated while the reset signal is supplied, or while the logic circuit controls the memory circuit to the standby state.

In the semiconductor integrated circuit, where the memory circuit is both in a reset state and in a standby state, the temperature of the semiconductor integrated circuit can be raised, thereby rapidly stabilizing operation of the semiconductor integrated circuit.

DETAILED DESCRIPTION

First Embodiment

Figure 1:
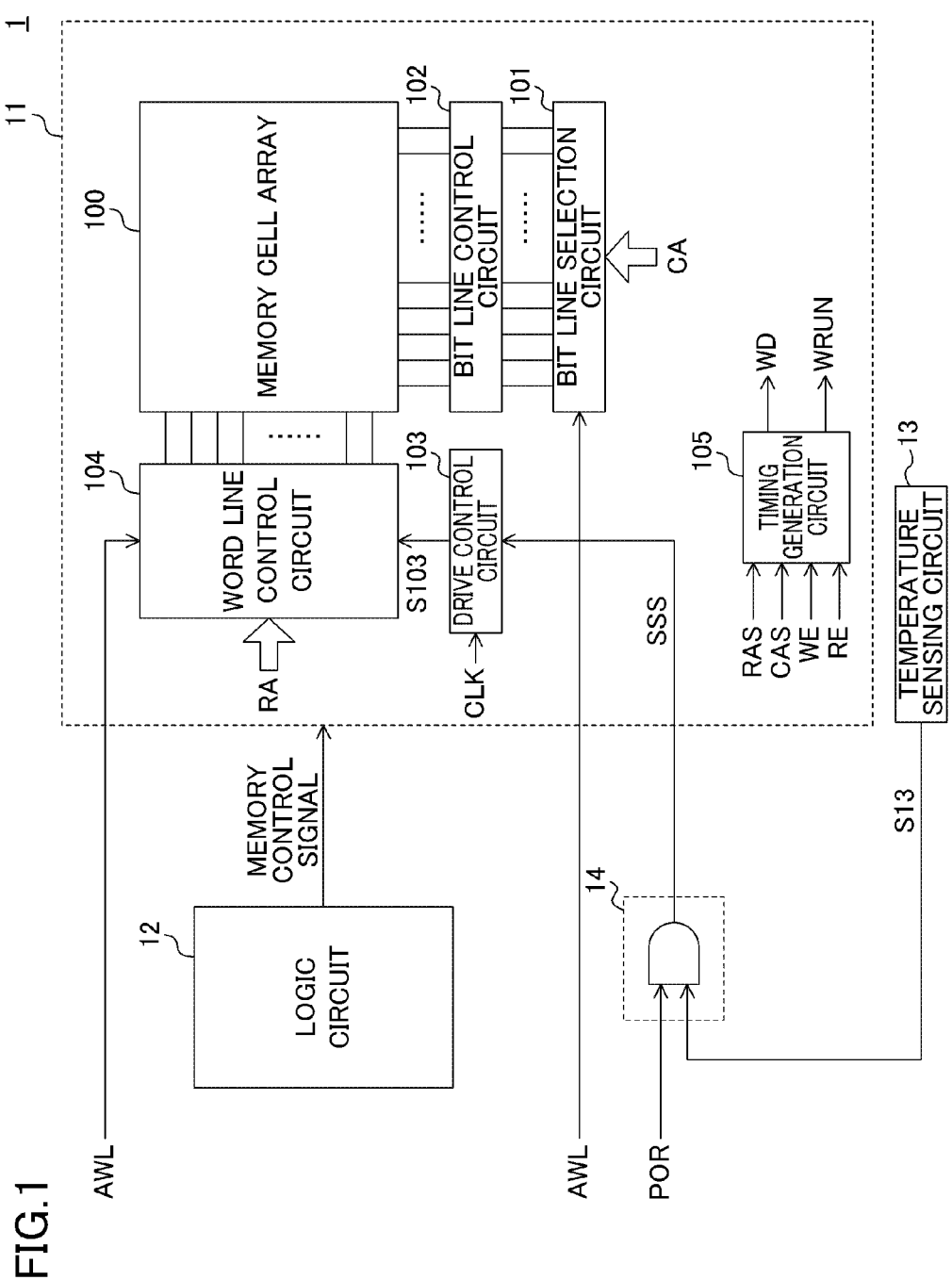
FIG. 1 is a configuration diagram of a semiconductor integrated circuit according to a first embodiment.

FIG. 1 illustrates a configuration of a semiconductor integrated circuit 1 according to a first embodiment. The semiconductor integrated circuit 1 includes a memory circuit 11, a logic circuit 12, a temperature sensing circuit 13, and a heat generation control circuit 14.

Logic Circuit

The logic circuit 12 outputs a memory control signal for controlling operation of the memory circuit 11. For example, the memory control signal includes a row address strobe signal RAS which is a trigger starting memory operation, a column address strobe signal CAS which is a trigger starting read operation, a write enable signal WE restricting an authorized state or an inhibit state of write operation, a read enable signal RE restricting an authorized state or an inhibit state of read operation, a clock signal CLK, a sense amplifier drive signal SE, and a precharge signal BP.

Temperature Sensing Circuit

The temperature sensing circuit 13 puts a sensing signal S13 into a high level (an activated state) when sensing that the temperature inside the semiconductor integrated circuit 1 (e.g., the temperature inside the memory circuit 11) is lower than a predetermined temperature.

Figure 2:
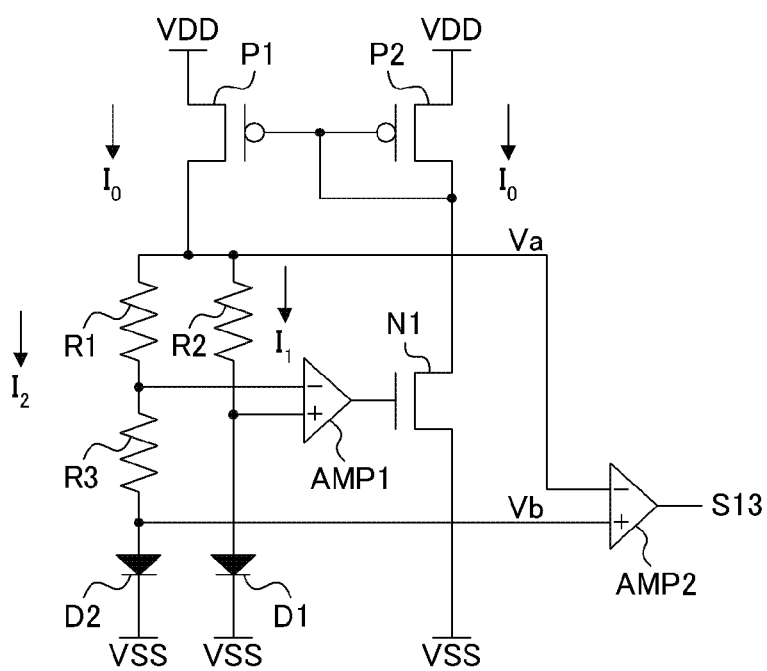
FIG. 2 is a configuration diagram of a temperature sensing circuit shown in FIG. 1.

As shown in FIG. 2, the temperature sensing circuit 13 include p-MOS transistors P1 and P2 each of which includes a source coupled to a power supply node (i.e., a node to which a power supply voltage VDD is supplied) and a gate coupled to a drain of the p-MOS transistor P2, resistors R1 and R3 and a diode D2 coupled in series between a drain of the p-MOS transistor P1 and a ground node (i.e., a node to which a ground voltage VSS is supplied), a resistor R2 and a diode D1 coupled in series between the drain of the p-MOS transistor P1 and the ground node, an operational amplifier AMP1 including an inverting input terminal (−) coupled to a connecting point of the resistors R1 and R3 and including a non-inverting input terminal (+) coupled to a connecting point of the resistor R2 and the diode D1, an n-MOS transistor N1 coupled between the drain of the p-MOS transistor P2 and the ground node and including a gate to which an output of the operational amplifier AMP1 is supplied, and an operational amplifier AMP2 including an inverting input terminal (−) to which a voltage Va generating at the connecting point of the p-MOS transistor P1 and the resistors R1 and R2 and including a non-inverting input terminal (+) to which an voltage Vb generating at a connecting point of the resistor R3 and the diode D2 is supplied.

Figure 3:
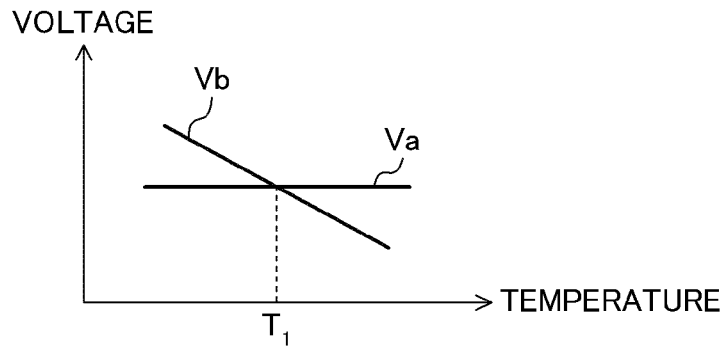
FIG. 3 illustrates characteristics of the temperature sensing circuit shown in FIG. 2.

Operation of the temperature sensing circuit 13 shown in FIG. 2 will be described below. A bandgap reference circuit is used for the temperature sensing circuit 13 of FIG. 2. As shown in FIG. 3, the voltage Va is a constant voltage not depending on a temperature. On the other hand, the voltage Vb is a threshold voltage of the diode D2, and thus has the characteristic that the voltage decreases with an increase in the temperature. Since the voltage Va is supplied to the inverting input terminal (−) of the operational amplifier AMP2, and the voltage Vb is supplied to the non-inverting input terminal (+) of the operational amplifier AMP2; the voltage Vb increases with reduction in the temperature, and the sensing signal S13 goes to a high level when the voltage Vb is higher than the voltage Va.

Then, operation of the temperature sensing circuit 13 will be described in detail. In the temperature sensing circuit 13, the p-MOS transistors P1 and P2 form a current mirror circuit, and thus, the ratio of currents flowing to the p-MOS transistors P1 and P2 are represented by the ratio of sizes of the p-MOS transistors P1 and P2. For example, when the p-MOS transistors P1 and P2 have a same size, the currents flowing to the p-MOS transistors P1 and P2 are equal. Thus, where a current flowing to the p-MOS transistors P1 and P2 are "I0," a current flowing through the current path from the drain of the p-MOS transistor P1 to the ground node via the resistor R2 and the diode D1 is "I1," and a current flowing through the current path from the drain of the p-MOS transistor P1 to the ground node via the resistors R1 and R3, and the diode D2 is "I2," the following equation 1 is obtained.

$$I0 = I1 + I2 \quad (1)$$

Also, current characteristics of the diodes are expressed by the following equation 2.

$$I = Is \cdot \exp((q \cdot Vd)/(k \cdot T)) \quad (2)$$

Note that, in the equation 2, "Is" denotes a saturation current, "q" denotes a charge amount of electrons, "Vd" denotes a threshold voltage, "k" denotes a Boltzmann constant, and "T" denotes an absolute temperature. The equation 2 can be transformed to the following equation 3.

$$Vd = kT/q \cdot \ln(I/Is) \quad (3)$$

Where a threshold voltage of the diode D1 is "Vd1," a saturation current of the diode D1 is "Is1," a threshold voltage of the diode D2 is "Vd2," and a saturation current of the diode D2 is "Is2;" a threshold voltage difference $\Delta Vd$ between the threshold voltages Vd1 and Vd2 is expressed by the following equation 4.

$$\Delta Vd = Vd1 - Vd2 = \{k/q \cdot \ln((I1 \cdot Is2)/(I2 \cdot Is1))\} \cdot T \quad (4)$$

Furthermore, a proportionality constant K1 is expressed by the following equation 5, the equation 4 is expressed by the following equation 6.

$$K1 = k/q \cdot \ln((I1 \cdot Is2)/(I2 \cdot Is1)) \quad (5)$$

$$\Delta Vd = K1 \cdot T \quad (6)$$

In the equation, since the proportionality constant K1 is a positive coefficient, the threshold voltage difference $\Delta Vd$ has positive temperature characteristics (i.e., the that a voltage value increases in accordance with a temperature rise).

Due to imaginary short of the operational amplifier AMP1, the following equations 7 and 8 are obtained.

$$R1 \cdot I2 = R2 \cdot I1 \quad (7)$$

$$Vd1 = Vd2 + R3 \cdot I2 \quad (8)$$

The following equations 9 and 10 are obtained by the equation 7.

$$I1/I2 = R1/R2 \quad (9)$$

$$I1 = I2 \cdot R1/R2 \quad (10)$$

Since $\Delta Vd = Vd1 - Vd2$, the following equation 11 is obtained from the equation 8.

$$I2 = \Delta Vd/R3 \quad (11)$$

Therefore, I1 is expressed by the following equation 12 using the equation 11.

$$I1 = (R1/R2) \cdot (\Delta Vd/R3) \quad (12)$$

Also, the following equation 13 is obtained from the equations 1, 4, and 9.

$$\begin{aligned} I0 &= (R1/R2) \cdot (\Delta Vd/R3) + \Delta Vd/R3 \\ &= (R1+R2)/(R2 \cdot R3) \cdot \{k/q \cdot \ln((I1 \cdot Is2)/(I2 \cdot Is1))\} \cdot T \\ &= (R1+R2)/(R2 \cdot R3) \cdot \{k/q \cdot \ln((R1 \cdot Is2)/(R2 \cdot IS1))\} \cdot T \end{aligned} \quad (13)$$

When a proportionality constant K2 is expressed by the following equation 14, the equation 13 is expressed by the following equation 15.

$$K2 = (R1+R2)/(R2 \cdot R3) \cdot k/q \cdot \ln((R1 \cdot Is2)/(R2 \cdot Is1)) \quad (14)$$

$$I0 = K2 \cdot T \quad (15)$$

Since the proportionality constant K2 is a positive coefficient, the constant current I0 has positive temperature characteristics (i.e., the characteristic that a current amount increases in accordance with a temperature rise).

The voltage Va is expressed by the following equation 16 using the equations 12 and 13.

$$\begin{aligned} Va &= Vd1 + R2 \cdot I1 \\ &= Vd1 + R2 \cdot \{(R1/R2) \cdot (\Delta Vd/R3)\} \\ &= Vd1 + R1/R3 \cdot \{(k/q) \cdot \ln(R1 \cdot Is2)/(R2 \cdot Is1))\} \cdot T \end{aligned} \quad (16)$$

When the equation 12 is substituted into the first equation of the equation 16 and is then transformed using the equation 6, the voltage Va is expressed by the following equation 17.

$$\begin{aligned} Va &= Vd1 + I1/R3 \cdot \Delta Vd \\ &= Vd1 + I1/R3 \cdot K1 \cdot T \end{aligned} \quad (17)$$

Furthermore, when a proportionality constant K3 is expressed by the following equation 18, the voltage Va is expressed by the following equation 19.

$$K3 = I1/R3 \cdot K1 \quad (18)$$

$$Va = Vd1 + K3 \cdot T \quad (19)$$

As shown in the equation 15, the constant current I0 has positive temperature characteristics. The equation 15 lacks a term dependent on a power supply voltage. Therefore, a constant current can be always supplied even when the power supply voltage changes. Also, resistance values of the resistors R1, R2, and R3, and the ratio of a saturation current of the diode D1 to D2 (Is2/Is1) are changed so that the temperature sensing circuit 13 has preferred temperature characteristics.

In the equation 19, since the "Vd1" which is the first term has negative temperature characteristics and "K3·T" which is the second term has positive temperature characteristics, the first term and the second term cancel the temperature characteristics each other. As a result, the voltage Va is not changed by a temperature change. Similar to the equation 15, the equation 19 lacks a term dependent on the power supply voltage. Therefore, a constant voltage can be always supplied even when the power supply voltage changes.

FIG. 3 illustrates temperature dependence of the voltage Va and the threshold voltage Vb of the diode D2 at the temperature sensing circuit 13. The voltage Va is a constant voltage as described above, and is thus not dependent on a temperature. The threshold voltage Vb of the diode D2 has negative temperature characteristics.

Figure 4:
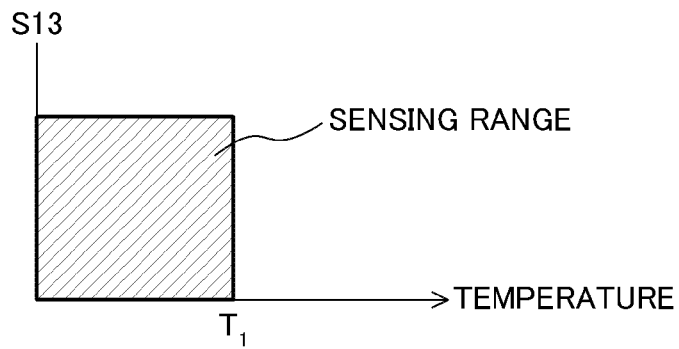
FIG. 4 illustrates a sensing range of the temperature sensing circuit shown in FIG. 2.

FIG. 4 illustrates a sensing range of the temperature sensing circuit 13. When a temperature is lower than a sensed temperature T1 which is the intersection of the voltage Va and the voltage Vb, the voltage Va is lower than the voltage Vb, and thus the sensing signal S13 goes to a high level. On the other hand, when a temperature is higher than the sensed temperature T1, the sensing signal S13 goes to a low level (a deactivated state).

Heat Generation Control Circuit

Referring back to FIG. 1, the heat generation control circuit 14 puts a heat generation control signal SSS into a high level (an activated state) when the sensing signal S13 from the temperature sensing circuit 13 goes to a high level while the memory circuit 11 is in a reset state. For example, the heat generation control circuit 14 is an AND circuit receiving the sensing signal S13 and a power-on reset signal POR. The power-on reset signal POR is input from the outside. When the power-on reset signal POR goes to a high level (an activated state), the memory circuit 11 goes to a reset state.

Memory Circuit

The memory circuit 11 includes a memory cell array 100, a bit line selection circuit 101, a bit line control circuit 102, a drive control circuit 103, a word line control circuit 104, and a timing generation circuit 105.

The memory cell array 100 includes a plurality of word lines and a plurality of bit line pairs intersecting each other, and a plurality of memory cells formed at intersections of the plurality of word lines and the plurality of bit line pairs.

The bit line selection circuit 101 is switchable between a normal mode and a heat generation mode by a test mode signal AWL. The bit line selection circuit 101 selects one of the plurality of bit line pairs in accordance with the column address signal CA in the normal mode, and selects all the bit line pairs in the heat generation mode.

The bit line control circuit 102 controls respective potential of the plurality of bit line pairs in response to the memory control signal from the logic circuit 12.

The drive control circuit 103 activates the drive signal S103 for driving the word line control circuit 104 in response to the memory control signal from the logic circuit 12 and the heat generation control signal SSS from the heat generation control circuit 14.

The word line control circuit 104 is switchable between a normal mode and a heat generation mode by the test mode signal AWL. The word line control circuit 104 is driven in response to the drive signal S103 from the drive control circuit 103. The word line control circuit 104 activates one of the plurality of word lines in accordance with a row address signal RA when driven in a normal mode, and activates two or more of the plurality of word lines when driven in a heat generation mode.

The timing generation circuit 105 outputs a word line drive timing control signal WD and a write control pulse WRUN in response to the row address strobe signal RAS, the column address strobe signal CAS, the write enable signal WE, and the read enable signal RE included in the memory control signal.

Memory Cell Array

Figure 5:
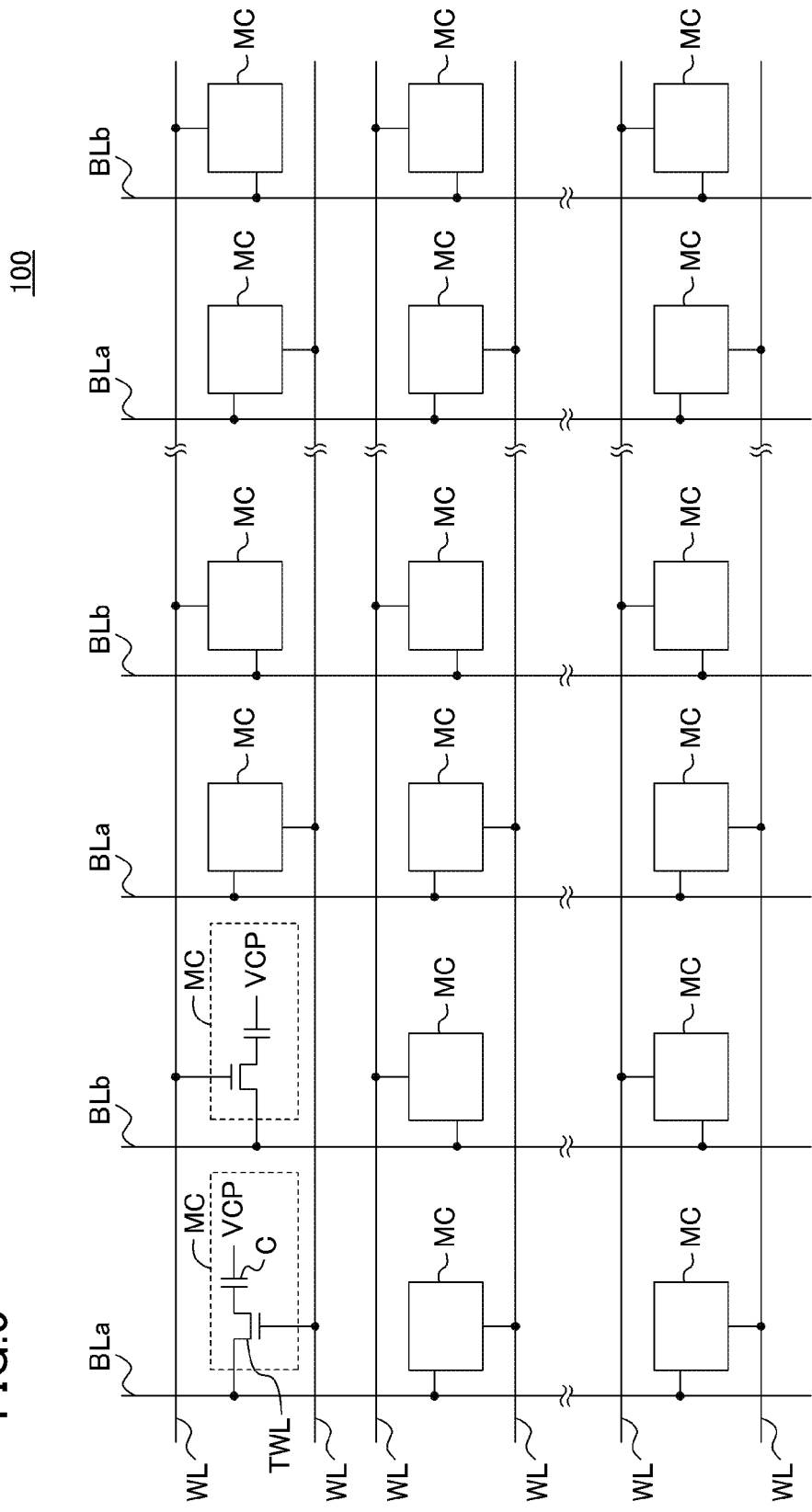
FIG. 5 is a configuration diagram of a memory cell array shown in FIG. 1.

FIG. 5 illustrates a configuration of the memory cell array 100 shown in FIG. 1.

The memory cell array 100 includes a plurality of word lines WL, WL, . . . , a plurality of bit line pairs BLa, BLb, BLa, BLb, . . . , and a plurality of memory cells MC, MC, . . . .

Each of the memory cells MC, MC, . . . corresponds to any one of the word lines WL, and any one of the bit lines BLa, BLa, . . . and the bit lines BLb, BLb, . . . . Each of the memory cells MC, MC, . . . includes a capacitor C which receives a cell plate voltage VCP (e.g., a ½ voltage of the power supply voltage VDD) supplied at an end, and an access transistor TWL coupled between the other end of the capacitor C and a bit line corresponding to the memory cell MC and including a gate coupled to a word line WL corresponding to the memory cell MC.

For example, when 256 word lines and 4096 bit line pairs are provided in the memory cell array 100, the total storage capacity of the memory cell array 100 is about 1 Mbit.

Bit Line Selection Circuit

Figure 6:
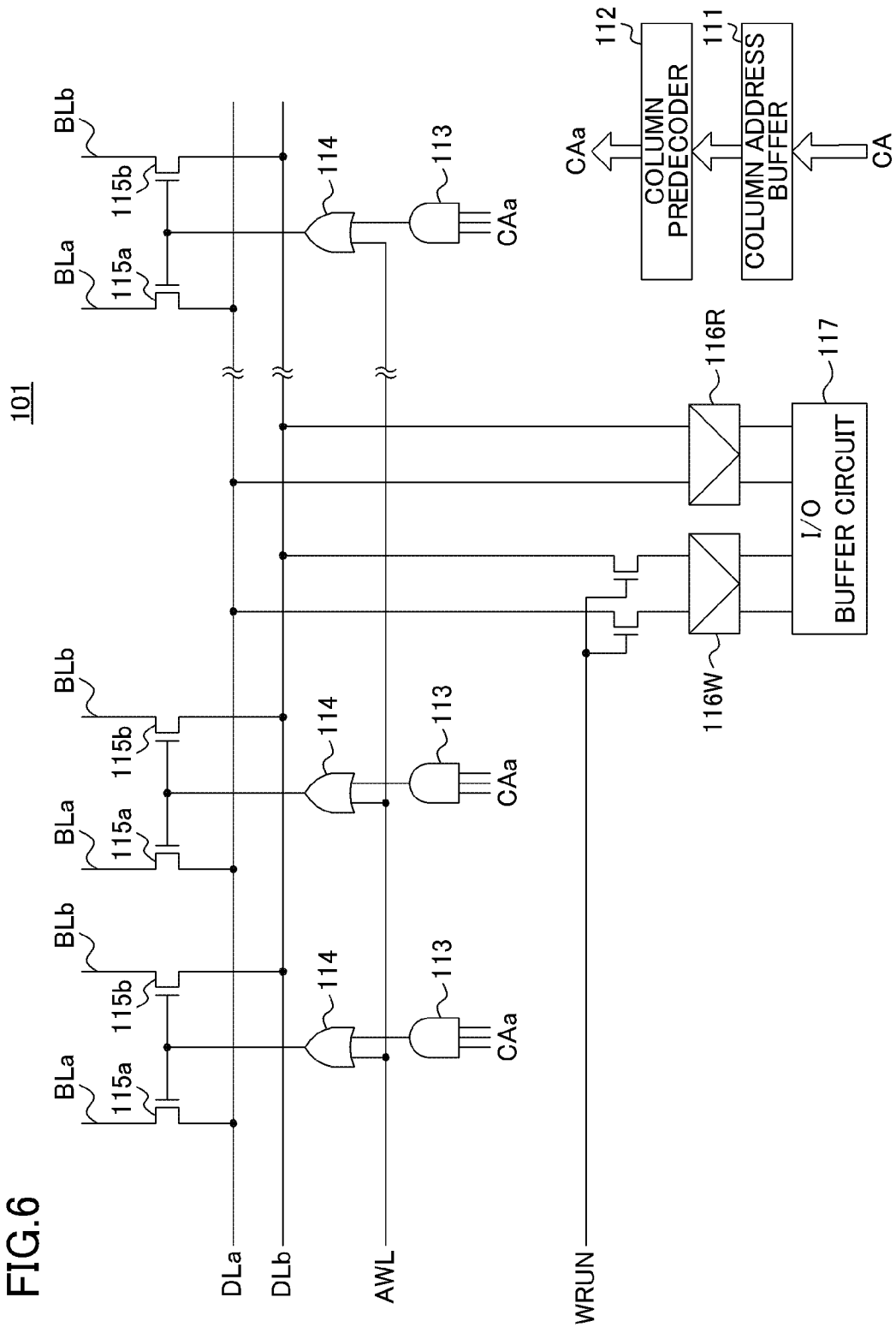
FIG. 6 is a configuration diagram of a bit line selection circuit shown in FIG. 1.

FIG. 6 illustrates a configuration of the bit line selection circuit 101 shown in FIG. 1. The bit line selection circuit 101 includes a column address buffer 111, a column predecoder 112, AND circuits 113, 113, . . . corresponding to the bit line pairs BLa, BLb, BLa, BLb, . . . , OR circuits 114, 114, . . . corresponding to the AND circuits 113, 113, . . . , column switch transistor pairs 115a, 115b, 115a, 115b, . . . corresponding to the OR circuits 114, 114, . . . , a write amplifier 116W, a read amplifier 116R, and an I/O buffer circuit 117.

The column address buffer 111 and the column predecoder 112 receive a column address signal CA from the outside and generate a column predecode signal CAa. Each of the AND circuits 113, 113, . . . receives the column predecode signal CAa from the column predecoder 112. In accordance with the column predecode signal CAa, one of outputs of the AND circuits 113, 113, . . . goes to a high level (an activated state).

Each of the OR circuits 114, 114, . . . receives the test mode signal AWL and an output of its corresponding AND circuit 113. When the test mode signal AWL is at a high level (in an activated state), all outputs of the OR circuits 114, 114, . . . go to a high level (an activated state). Each of the column switch transistor pairs 115a, 115b, 115a, 115b, . . . receives an output of its corresponding OR circuit 114 at its gate, and switches the coupling of the bit line pair BLa and BLb and the data line pair DLa and DLb for reading and writing data in response to the output of the OR circuit 114. Each of the column switch transistor pairs 115a, 115b, 115a, 115b, . . . couples the data line pair DLa and DLb to its corresponding bit line pair BLa and BLb, when the output of its corresponding OR circuit 114 goes to a high level.

The read amplifier 116R amplifies data read by the data line pair DLa and DLb, and outputs the amplified read data to the I/O buffer circuit 117. The write amplifier 116W amplifies written data from the I/O buffer circuit 117, and output the amplified written data to the data line pair DLa and DLb via an n-type switch transistor pair controlled by the write control pulse WRUN.

Bit Line Control Circuit

Figure 7:
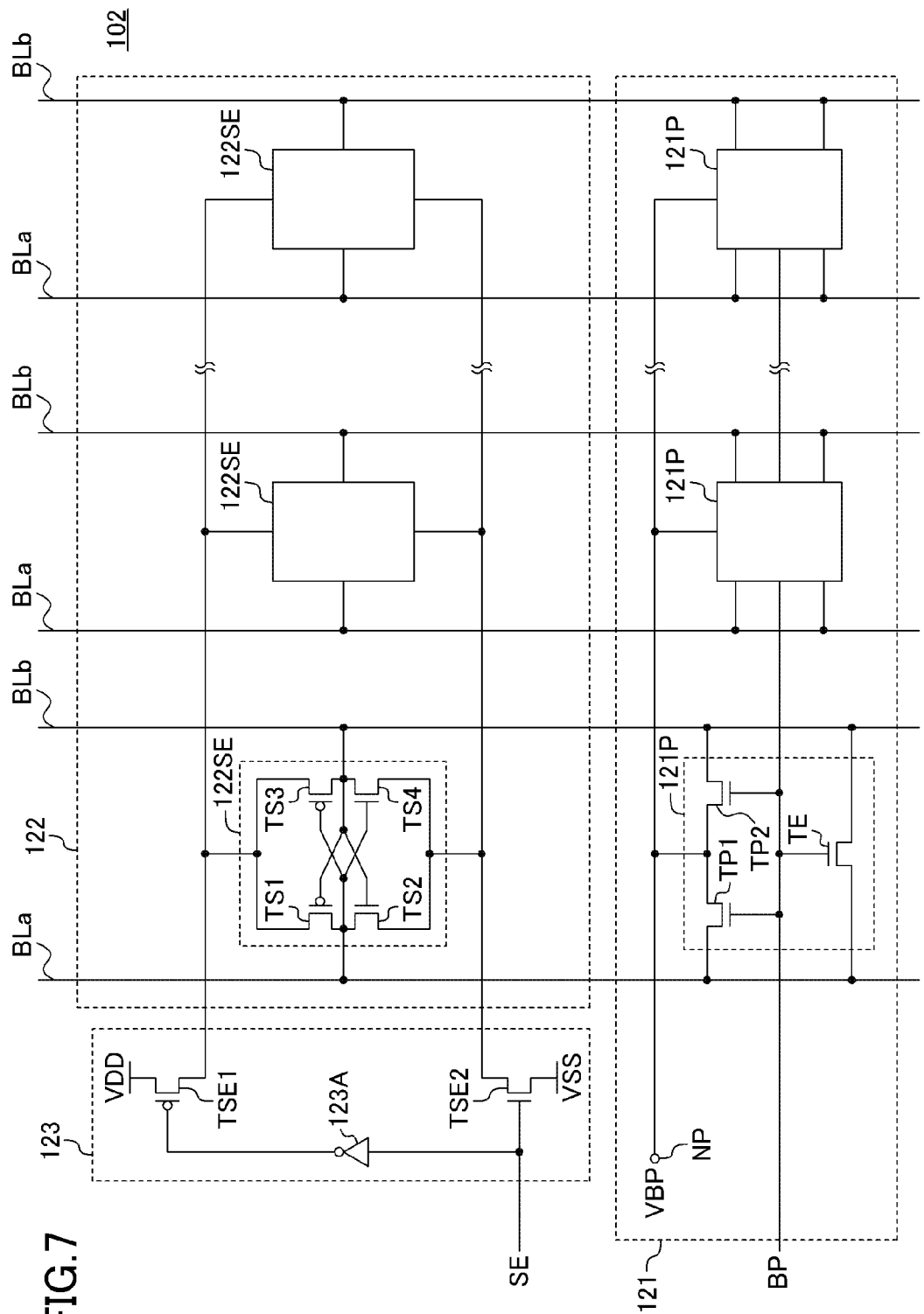
FIG. 7 is a configuration diagram of a bit line control circuit shown in FIG. 1.

FIG. 7 illustrates a configuration of the bit line control circuit 102 shown in FIG. 1. The bit line control circuit 102 includes a precharge circuit 121, a sense amplifier circuit 122, and a sense amplifier driving circuit 123.

The precharge circuit 121 couples the bit line pairs BLa, BLb, BLa, BLb, . . . to a precharge node NP receiving a precharge voltage VBP (a ½ voltage of the power supply voltage VDD) in response to the precharge signal BP included in the memory control signal and short-circuits the bit line pairs BLa, BLb, BLa, BLb, . . . . The precharge circuit 121 includes precharge sections 121P, 121P, . . . corresponding to the bit line pairs BLa, BLb, BLa, BLb, . . . . Each of the precharge sections 121P, 121P, . . . includes an equalizing transistor TE, and precharge transistors TP1 and TP2. The equalizing transistor TE is coupled between the bit lines BLa and BLb, and receives the precharge signal BP at its gate.

The precharge transistor TP1 includes a source coupled to the bit line BLa, a drain coupled to the precharge node NP, and a gate receiving the precharge signal BP. The precharge transistor TP2 includes a source coupled to the bit line BLb, a drain coupled to the precharge node NP, and a gate receiving the precharge signal BP. When the precharge signal BP is at a high level (in an activated state), the equalizing transistor TE short-circuits the bit lines BLa and BLb. The precharge transistors TP1 and TP2 couple the precharge node NP to the bit lines BLa and BLb, respectively.

The sense amplifier circuit 122 includes sense amplifiers 122SE, 122SE, . . . corresponding to the bit line pairs BLa, BLb, BLa, BLb, . . . . Each of the sense amplifiers 122SE, 122SE, . . . includes sense amplifier transistors TS1 and TS2 forming a first inverter, and sense amplifier transistors TS3 and TS4 forming a second inverter. The first and second inverters are flip-flop coupled. An output terminal of the first inverter (the connecting point of the sense amplifier transistors TS1 and TS2) is coupled to the bit line BLa, and an output terminal of the second inverter (the connecting point of the sense amplifier transistors TS3 and TS4) is coupled to the bit line BLb.

The sense amplifier driving circuit 123 includes sense amplifier drive transistors TSE1 and TSE2, and an inverter 123A. When the sense amplifier drive signal SE included in the memory control signal is at a high level (an activated state), the sense amplifier drive transistor TSE1 couples sources of the sense amplifier transistors TS1 and TS3 included in each of the sense amplifiers 122SE, 122SE, . . . to the power supply node. The sense amplifier drive transistor TSE2 couples sources of the sense amplifier transistors TS2 and TS4 included in each of the sense amplifiers 122SE, 122SE, . . . to the ground node. This supplies the power supply voltage VDD and the ground voltage VSS to the sense amplifiers 122SE, 122SE, . . . . Each of the sense amplifiers 122SE, 1225E, . . . amplifies the potential difference between its corresponding bit line pair BLa and BLb.

As such, the sense amplifier circuit 122 couples each of the bit line pairs BLa, BLb, BLa, BLb, . . . to the power supply node and the ground node in response to the sense amplifier drive signal SE, thereby amplifying the potential difference in each of the bit line pairs BLa, BLb, BLa, BLb . . . .

Drive Control Circuit

Figure 8:
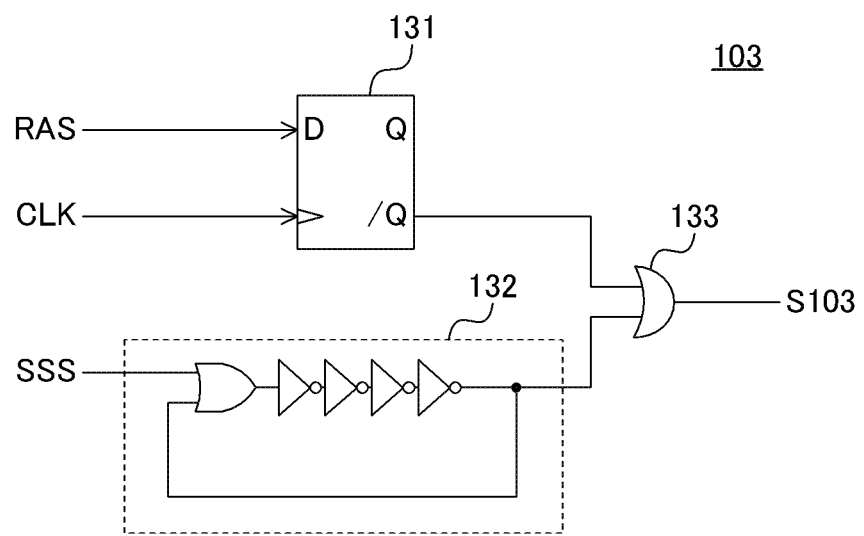
FIG. 8 is a configuration diagram of a drive control circuit shown in FIG. 1.

FIG. 8 illustrates a configuration of the drive control circuit 103 shown in FIG. 1. The drive control circuit 103 includes a flip-flop 131 receiving the row address strobe signal RAS and the clock signal CLK, an oscillation circuit 132 oscillating in response to the heat generation control signal SSS from the heat generation control circuit 14, and an OR circuit 133 outputting an output of the flip-flop 131 and an output of the oscillation circuit 132 as the drive signal S103 (an internal row address strobe signal). When at least one of the memory control signal (the row address strobe signal RAS and the clock signal CLK) or the heat generation control signal SSS is in an activated state, the drive control circuit 103 activates the drive signal S103.

Word Line Control Circuit 104

Figure 9:
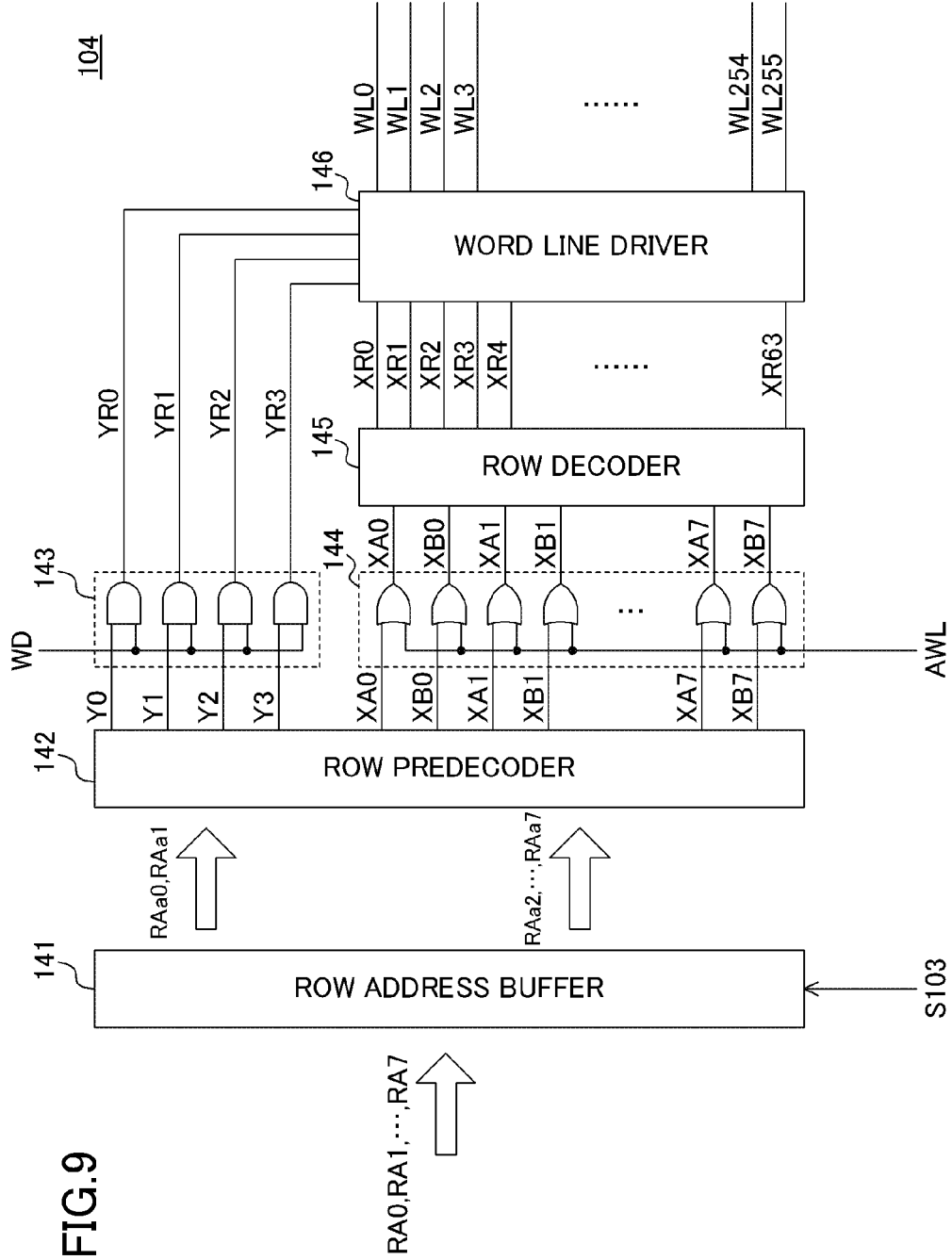
FIG. 9 is a configuration diagram of a word line control circuit shown in FIG. 1.

FIG. 9 illustrates a configuration of the word line control circuit 104 shown in FIG. 1. The word line control circuit 104 includes a row address buffer 141, a row predecoder 142, a word line drive signal generation circuit 143, a word lines activation control circuit 144, a row decoder 145, and a word line driver 146. Note that, in this embodiment, the word line control circuit 104 is coupled to 256 word lines WL0, WL1, . . . , WL255.

The row address buffer 141 is driven in response to the drive signal S103 from the drive control circuit 103. The row address buffer 141 generates internal row address signals RAa0, RAa1, . . . , RAa7 in response to external row address signals RA0, RA1, . . . , RA7.

The row predecoder 142 generates four selection signals Y0, Y1, Y2, and Y3, eight row address predecode signals XA0, XA1, . . . , XA7, and eight row address predecode signals XB0, XB1, . . . , XB7 in response to the internal row address signals RAa0, RAa1, . . . , RAa7.

The word line drive signal generation circuit 143 outputs the selection signals Y0, Y1, Y2, and Y3 as the word line drive signals YR0, YR1, YR2, and YR3 in response to the word line drive timing control signal WD from the timing generation circuit 105. For example, the word line drive signal generation circuit 143 includes four AND circuits receiving the word line drive timing signal WD and the selection signals Y0, Y1, Y2, and Y3, respectively.

The word lines activation control circuit 144 outputs the row address predecode signals XA0, XA1, . . . , XA7, XB0, XB1, . . . , XB7 without any change when the test mode signal AWL is at a low level (a deactivated state). The word lines activation control circuit 144 puts all the row address predecode signals XA0, XA1, . . . , XA7, XB0, XB1, . . . , XB7 into a high level (an activated state) when the test mode signal AWL is at a high level (an activated state). For example, the word lines activation control circuit 144 includes 16 OR circuits receiving the test mode signal AWL and the row address predecode signals XA0, XA1, . . . , XA7, XB0, XB1, . . . , XB7, respectively.

The row decoder 145 generates 64 row address decode signals XR0, XR1, . . . , XR63 in response to the row address predecode signals XA0, XA1, . . . , XA7, XB0, XB1, . . . , XB7 from the word lines activation control circuit 144.

The word line driver 146 control activation/deactivation of the 256 word lines WL0, WL1, . . . , WL255 in response to four word line drive signals YR0, YR1, YR2, and YR3 from the word line drive signal generation circuit 143, and the 64 row address decode signals XR0, XR1, . . . , XR63 from the row decoder 145.

Figure 10:
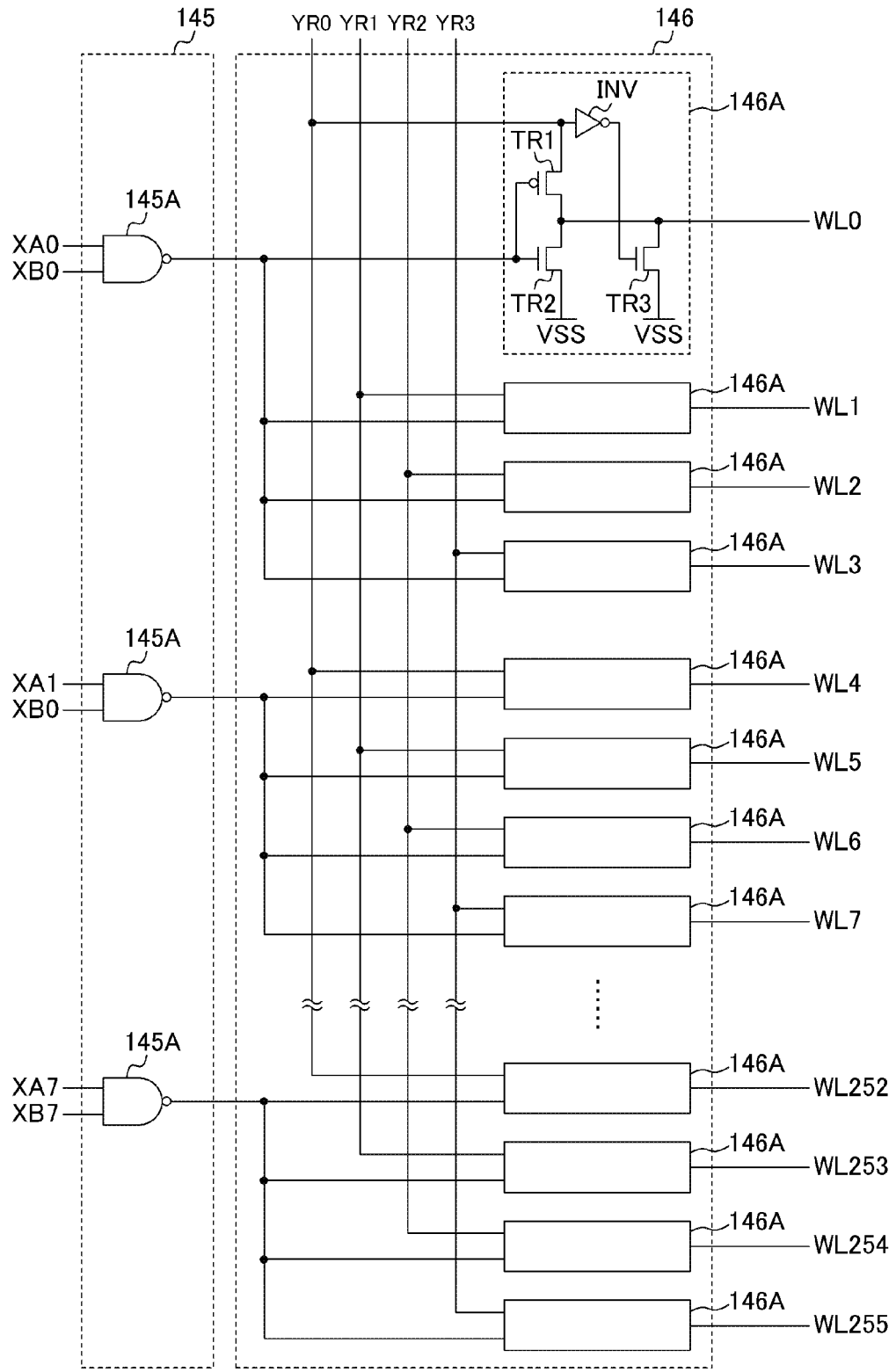
FIG. 10 is a configuration diagram of a row decoder and a word line driver shown in FIG. 9.

FIG. 10 illustrates configurations of the row decoder 145 and the word line driver 146 shown in FIG. 9.

The row decoder 145 includes 64 unit row decoders 145A, 145A, . . . . The eight unit row decoders 145A, 145A, . . . at the $0^{th}$ to the $7^{th}$ stages receive the $0^{th}$ row address predecode signal XB0, and the $0^{th}$ to $7^{th}$ row address predecode signals XA0, XA1, . . . , XA7, respectively. The unit row decoder 145A at the $63^{rd}$ stage receives the $7^{th}$ row address predecode signal XB7 and the $7^{th}$ row address predecode signal XA7. That is, 64 combinations of the 8 row address predecode signals XA0, XA1, . . . , XA7 and the 8 row address predecode signals XB0, XB1, . . . , XB7 are supplied to the 64 unit row decoders 145A, 145A, . . . , respectively. Each of the unit row decoders 145A, 145A, . . . puts its output into a low level (an activated state) when both of its two corresponding row address predecode signals are at a high level. For example, the unit row decoder 145A is formed by a NAND circuit receiving two row address predecode signals.

The word line driver 146 includes 256 unit word line drivers 146A, 146A, . . . corresponding to the 256 word lines WL0, WL1, . . . , WL255. The four unit word line drivers 146A, 146A, . . . at the $0^{th}$ to $3^{rd}$ stages receive an output of the unit row decoder 145A at the $0^{th}$ stage, and the word line drive signals YR0, YR1, YR2, and YR3, respectively. The four unit word line drivers 146A, 146A, . . . at the $252^{nd}$ to $255^{th}$ stages receive an output of the unit row decoder 145A at the $63^{rd}$ stage, and the word line drive signals YR0, YR1, YR2, and YR3, respectively. That is, 256 combinations of four word line drive signals and outputs of 64 unit row decoders are supplied to the 256 unit word line drivers 146A, 146A, . . . , respectively. Each of the unit word line drivers 146A, 146A, . . . activates its corresponding word line when both of its corresponding word line drive signal and an output of the unit row decoder 145A are in an activated state (when the word line drive signal is at a high level, and the output of the unit row decoder 145A is at a low level).

Each of the unit word line drivers 146A, 146A, . . . includes transistors TR1, TR2, and TR3, and an inverter INV. The transistor TR1 includes a source receiving the corresponding word line drive signal, a drain coupled to the corresponding word line, and a gate receiving an output of the corresponding unit row decoder 145A. The transistor TR2 includes a source coupled to the ground node, and a drain coupled to the corresponding word line, and a gate receiving an output of the corresponding unit row decoder 145A. The inverter INV inverts the corresponding word line drive signal. The transistor TR3 includes a source coupled to the ground node, a drain coupled to the corresponding word line, and a gate receiving an output of the inverter INV.

Normal Operation

Figure 11:
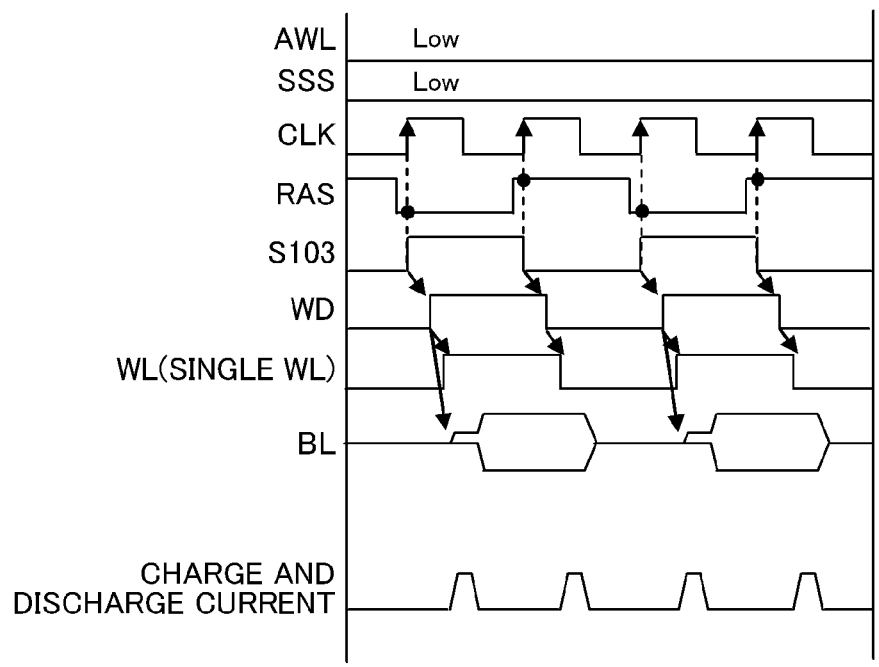
FIG. 11 is a timing chart for illustrating normal operation of the semiconductor integrated circuit shown in FIG. 1

Next, referring to FIG. 11, normal operation of the semiconductor integrated circuit 1 shown in FIG. 1 will be described. Note that, in this embodiment, a reset period after power-on has passed (the power-on reset signal POR is at a low level). In normal operation, the test mode signal AWL is always at a low level (in a deactivated state).

Since the power-on reset signal POR is at a low level, the heat generation control circuit 14 puts the heat generation control signal SSS into a low level. Thus, the oscillation circuit 132 is not driven in the drive control circuit 103. On the other hand, since the memory control signal (the row address strobe signal RAS and the clock signal CLK) is supplied from the logic circuit 12, the OR circuit 133 outputs the output of the flip-flop 131 as the drive signal S103.

Then, in the word line control circuit 104, the row address buffer 141 goes to a drive state in response to the drive signal S103 from the drive control circuit 103. Thus, the row address buffer 141 receives the row address signals RA0, RA1, . . . , synchronization with the drive signal S103, and outputs the internal row address signals RAa0, RAa1, . . . RAa7. The row predecoder 142 selects any one of the selection signals Y0, Y1, Y2, and Y3, any one of the row address predecode signals XA0, XA1, . . . , XA7, and any one of the row address predecode signals XB0, XB1, . . . , XB7 in accordance with the internal row address signals RAa0, RAa1, . . . , RAa7, and puts the selected signals into a high level. Note that, in normal operation, since the test mode signal AWL is at a low level, the word lines activation control circuit 144 outputs the row address predecode signals XA0, XA1, . . . , XA7, XB0, XB1, . . . , XB7 without any change.

Next, the row decoder 145 puts any one of the row decode signals XR0, XR1, . . . , XR63 into a low level in accordance with inactivation/deactivation of the row address predecode signals XA0, XA1, . . . , XA7, XB0, XB1, . . . , XB7. The word line drive signal generation circuit 143 outputs the selection signals Y0, Y1, Y2, and Y3 as the word line drive signals YR0, YR1, YR2, and YR3 in response to the word line drive timing control signal WD. Then, the word line driver 146 activates any one of the 256 word lines WL0, WL1, . . . , WL255 in accordance with inactivation/deactivation of the word line drive signals YR0, YR1, YR2, and YR3, and XR0, XR1, . . . , XR63. As such, any one of the 256 word lines WL0, WL1, . . . , WL255 is activated, thereby transferring a charge held in each of the memory cells MC, MC, . . . corresponding to the word line WL to the bit lines BLa and BLb corresponding to the memory cells.

Then, after a certain time has passed after the word line drive timing control signal WD goes to an activated state (after the word line WL is activated), the sense amplifier drive signal SE goes to an activated state, and the sense amplifier circuit 122 amplifies the potential difference in each of the bit line pairs BLa, BLb, BLa, BLb, . . . . This determines values of data read out from the bit line pairs BLa, BLb, BLa, BLb, . . . . The data is read in this manner.

Test Operation

Figure 12:
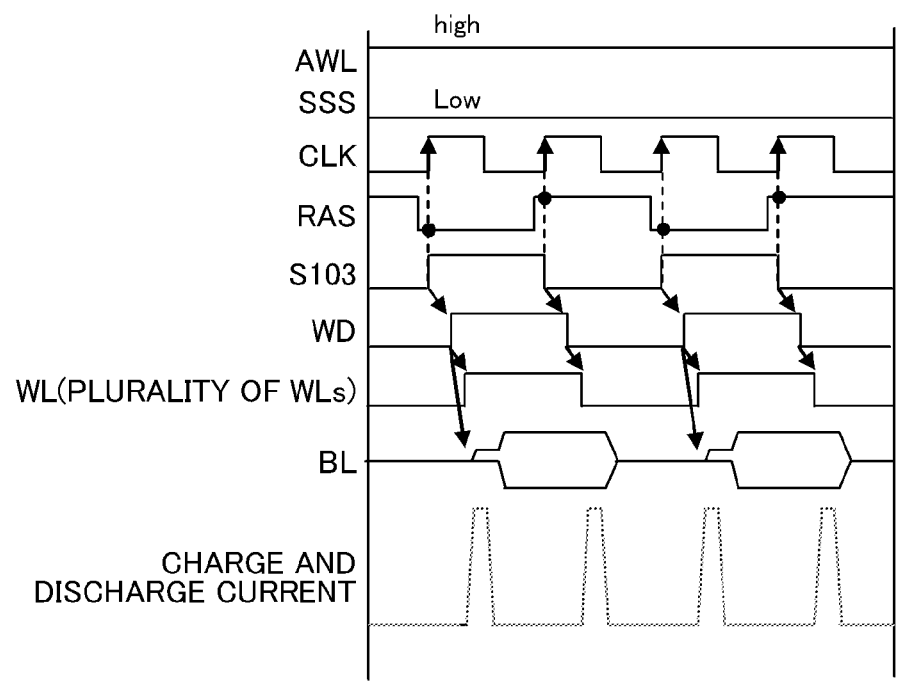
FIG. 12 is a timing chart for illustrating test operation of the semiconductor integrated circuit shown in FIG. 1.

Next, referring to FIG. 12, test operation of the semiconductor integrated circuit 1 shown in FIG. 1 will be described. Note that, in this embodiment, a reset period after power-on has passed (the power-on reset signal POR is at a low level). In test operation, the test mode signal AWL is at a high level.

Similar to normal operation, since the power-on reset signal POR is at a low level, the heat generation control circuit 14 puts the heat generation control signal SSS into a low level. This allows the OR circuit 133 to output the output of the flip-flop 131 as the drive signal S103 in the drive control circuit 103.

Then, similar to normal operation, in the word line control circuit 104, the row address buffer 141 receives the row address signals RA0, RA1, . . . , RA7 in synchronization with the drive signal S103 from the drive control circuit 103. The row predecoder 142 selects any one of the selection signals Y0, Y1, Y2, and Y3, any one of the row address predecode signals XA0, XA1, . . . , XA7, and any one of the row address predecode signals XB0, XB1, . . . , XB7. Note that, in this embodiment, since the test mode signal AWL is at a high level, the word lines activation control circuit 144 puts all the row address predecode signals XA0, XA1, . . . , XA7, XB0, XB1, . . . , XB7 into a high level.

Next, the row decoder 145 puts all the row decode signals XR0, XR1, . . . , XR63 into a low level, since all the row address predecode signals XA0, XA1, . . . , XA7, XB0, XB1, . . . , XB7 are a high level.

Since any one of the word line drive signals Y0, Y1, Y2, and Y3 is at a high level, and all the row decode signals XR0, XR1, . . . , XR63 are at a low level, the word line driver 146 activates 64 of the 256 word lines WL0, WL1, . . . , WL255 for the word line drive signal at the high level. As a result, the sum of charge and discharge currents of the 256 word lines WL0, WL1, . . . , WL255 is 64 times as great as that in normal operation.

A charge is transferred from each of the memory cells MC, MC, . . . corresponding to the 64 word lines to the bit lines BLa and BLb corresponding to the memory cell. Thus, charges are transferred from 64 memory cells MC to a single pair of the bit lines BLa and BLb at the same time, and charge and discharge currents at the bit lines BLa, BLb, BLa, BLb, . . . are as 64 times as great as those in normal operation. Furthermore, in test operation, since all the bit line pairs BLa, BLb, BLa, BLb, . . . are selected, the sum of the charge and discharge currents at the bit lines BLa, BLb, BLa, BLb, . . . is greater than that in normal operation (where only a single bit line pair is selected).

Test Operation in Reset Period After Power-On

Figure 13:
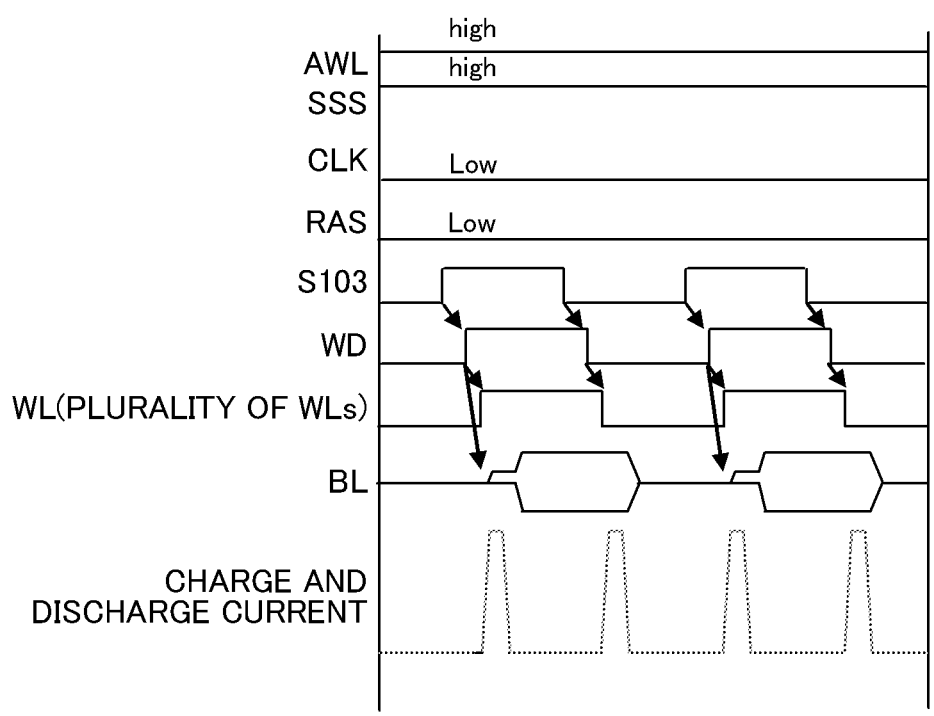
FIG. 13 is a timing chart for illustrating test operation (i.e., test operation in a reset period after power-on) of the semiconductor integrated circuit shown in FIG. 1.

Next, referring to FIG. 13, test operation (test operation in a reset period after power-on) of the semiconductor integrated circuit 1 shown in FIG. 1 will be described. Note that, in a reset period after power-on, the power-on reset signal POR is at a high level. The test mode signal AWL is at a high level.

Where the sensing signal S13 is at a high level (where the temperature inside the semiconductor integrated circuit 1 is lower than the sensed temperature T1), since the power-on reset signal POR is at a high level, the heat generation control circuit 14 puts the heat generation control signal SSS into a high level. In the drive control circuit 103, since the memory control signal (the row address strobe signal RAS and the clock signal CLK) is not supplied from the logic circuit 12, the output of the flip-flop 131 remains at a low level. On the other hand, since the heat generation control signal SSS goes to a high level, the oscillation circuit 132 oscillates. This allows the OR circuit 133 to output the output of the oscillation circuit 132 as the drive signal S103.

Then, in the word line control circuit 104, similar to the above-described test operation, the row address buffer 141 receives the row address signals RA0, RA1, . . . , RA7 in synchronization with the drive signal S103 from the drive control circuit 103. However, since the test mode signal AWL is at a high level, the word lines activation control circuit 144 puts all the row address predecode signals XA0, XA1, . . . , XA7, XB0, XB1, . . . , XB7 into a high level. Then, the word line driver 146 activates 64 of the 256 word lines WL0, WL1, . . . , WL255. As a result, the sum of charge and discharge currents at word lines WL0, WL1, . . . , WL255 is as 64 times as great as that in normal operation.

On the other hand, when the sensing signal S13 goes to a low level (when the temperature inside the semiconductor integrated circuit 1 is higher than the sensed temperature T1), the heat generation control circuit 14 puts the heat generation control signal SSS into a low level. As a result, in the drive control circuit 103, the oscillation circuit 132 stops and the word line control circuit 104 also stops.

As described above, many currents can be generated in the memory cell array 100 in test operation, as compared to normal operation, thereby increasing the amount of heat generation in the memory circuit 11. This rapidly raises the temperature inside the memory circuit 11, resulting in a rapid rise in the temperature of the semiconductor integrated circuit 1. Furthermore, when the temperature inside the semiconductor integrated circuit 1 is lower than a predetermined temperature while the memory circuit 11 is in a reset state, the drive control circuit 103 activates the drive signal S103 based on the heat generation control signal SSS. Thus, many currents can be generated in the memory circuit 11 as compared to normal operation. As such, the temperature in the semiconductor integrated circuit 1 can be raised even when the memory circuit 11 is in a reset state, thereby rapidly stabilizing operation of the semiconductor integrated circuit 1.

In test operation, since the bit line selection circuit 101 selects all the bit line pairs BLa, BLb, BLa, BLb, . . . , the amount of heat generation in the memory cell array can be further increased. Note that, when the test mode signal AWL is at a high level, the bit line selection circuit 101 may select not all the bit line pairs BLa, BLb, BLa, BLb, . . . but two or more of the bit line pairs.

Note that the heat generation control circuit 14 may operate in response to only the sensing signal S13 from the temperature sensing circuit 13 regardless of the signal level of the power-on reset signal POR. That is, even when the power-on reset signal POR is at a low level, the heat generation control circuit 14 may put a heat generation control signal S14 into a high level when the sensing signal S13 goes to a high level. This configuration also rapidly stabilizes operation of the semiconductor integrated circuit 1, even when the semiconductor integrated circuit 1 is at a low temperature.

Second Embodiment

Figure 14:
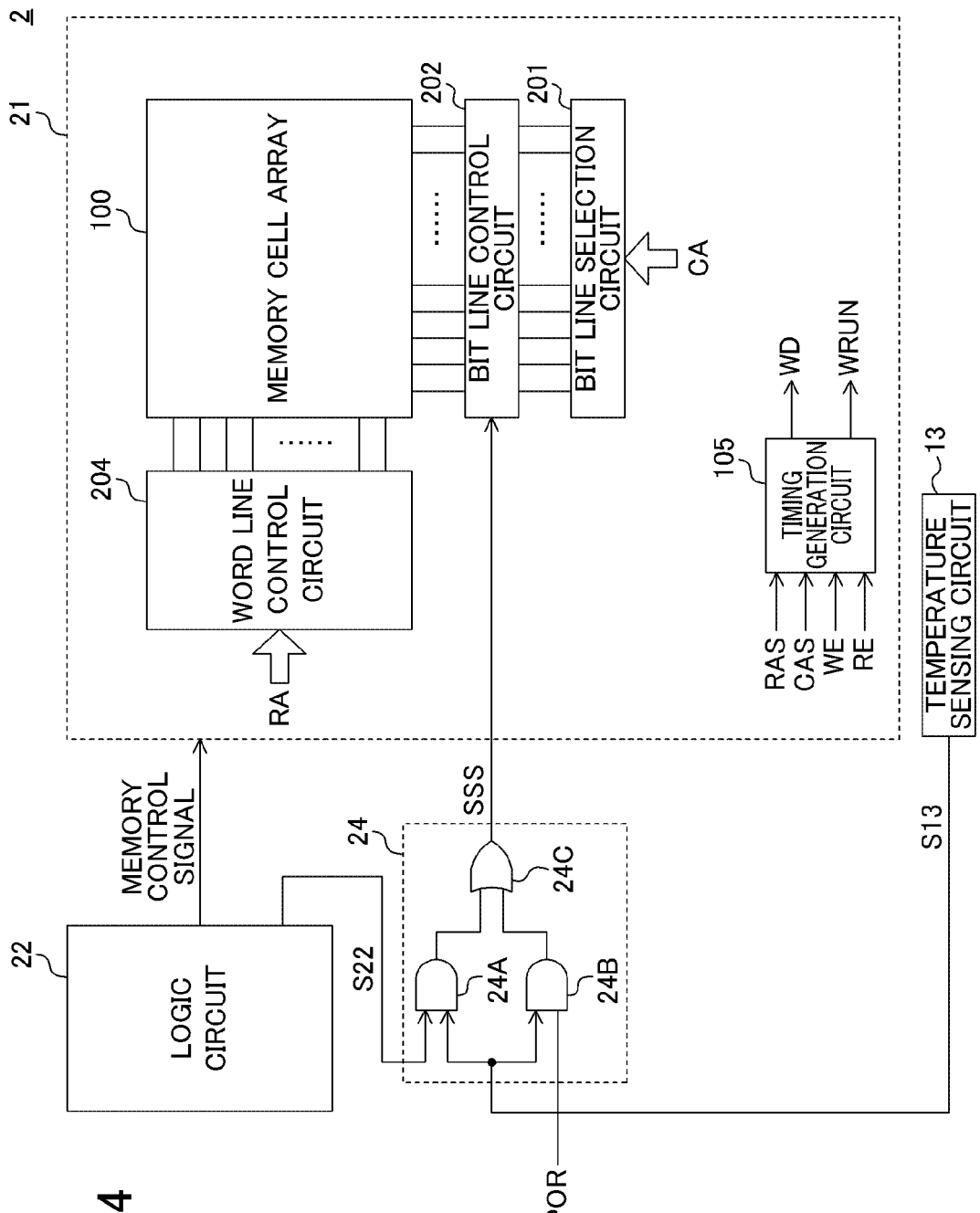
FIG. 14 is a configuration diagram of a semiconductor integrated circuit according to a second embodiment.

FIG. 14 illustrates a semiconductor integrated circuit 2 according to a second embodiment. The semiconductor integrated circuit 2 includes a memory circuit 21, a logic circuit 22, a heat generation control circuit 24, and the temperature sensing circuit 13 shown in FIG. 1.

Logic Circuit

Similar to the logic circuit 12 shown in FIG. 1, the logic circuit 22 outputs a memory control signal. Furthermore, when values of various signals included in a memory control signal (e.g., a row address strobe signal RAS, a column address strobe signal CAS, a write enable signal WE, a read enable signal RE, a clock signal CLK, etc.) are in a specific combination, the logic circuit 22 outputs a memory activation signal S22. When the signal values of the various signals included in the memory control signal are in the specific combination, the memory circuit 21 goes to a standby state (a state in which information cannot be read from or write on the memory circuit 21). That is, the memory activation signal S22 shows that the memory circuit 21 is in a standby state.

Heat Generation Control Circuit

Similar to the heat generation control circuit 14 shown in FIG. 1, the heat generation control circuit 24 puts the heat generation control signal SSS into a high level, when the sensing signal S13 from the temperature sensing circuit 13 goes to a high level while the memory circuit 21 is in a reset state. Furthermore, the heat generation control circuit 24 puts the heat generation control signal SSS into a high level, when the sensing signal S13 from the temperature sensing circuit 13 goes to a high level while the memory circuit 21 is a standby state (while the memory activation signal S22 is at a high level (in an activated state)). For example, the heat generation control circuit 24 includes an AND circuit 24A receiving the sensing signal S13 and the memory activation signal S22, and an AND circuit 24B receiving the sensing signal S13 and the power-on reset signal POR, and an OR circuit 24C receiving outputs of the AND circuits 24A and 24B.

Memory Circuit

The memory circuit 21 includes a bit line selection circuit 201, a bit line control circuit 202, a word line control circuit 204, and the memory cell array 100 and the timing generation circuit 105 shown in FIG. 1.

Figure 15:
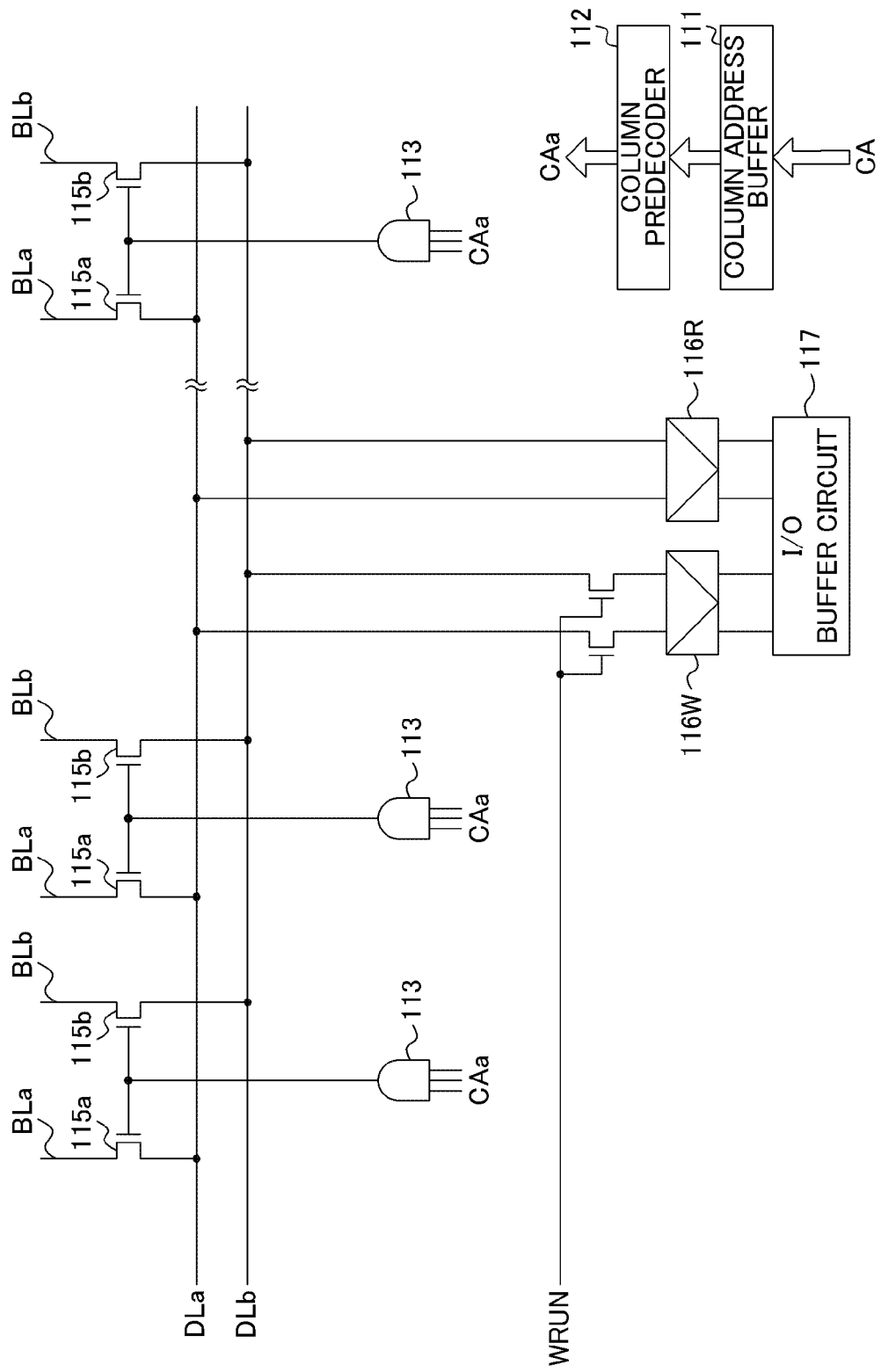
FIG. 15 is a configuration diagram of a bit line selection circuit shown in FIG. 14.

The bit line selection circuit 201 selects one of a plurality of bit line pairs in accordance with the column address signal CA. As shown in FIG. 15, the configuration of the bit line selection circuit 201 corresponds to a configuration excluding the OR circuits 114, 114, . . . from the bit line selection circuit 101 shown in FIG. 6. In the bit line selection circuit 201 shown in FIG. 15, each of the column switch transistor pairs 115a, 115b, 115a, 115b, . . . receives an output of its corresponding AND circuits 113 at its gate.

The bit line control circuit 202 controls potential of each of the bit line pairs in response to the memory control signal from the logic circuit 22. The bit line control circuit 202 generates a current in itself in response to the heat generation control signal SSS from the heat generation control circuit 24 to generate heat.

Figure 16:
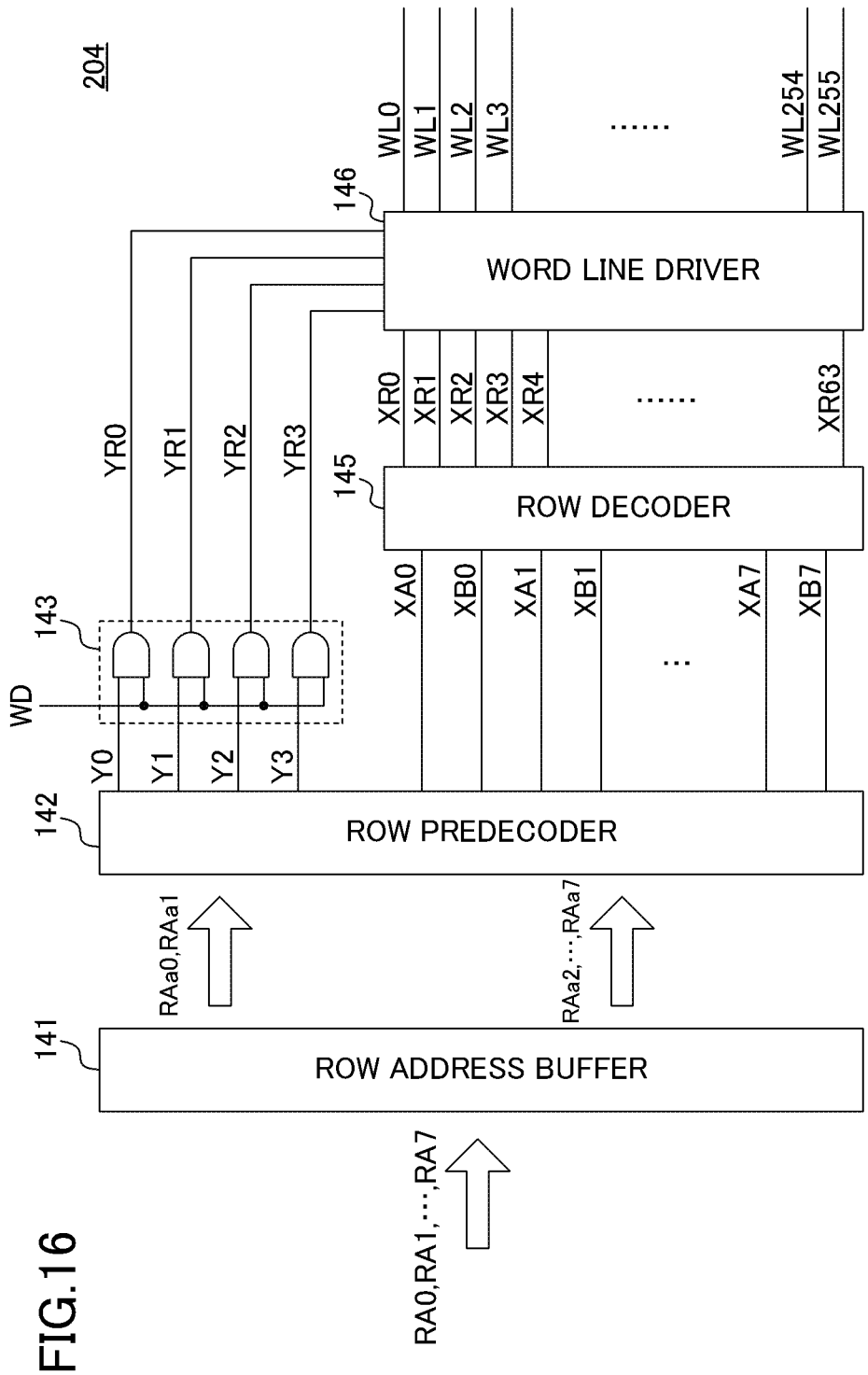
FIG. 16 is a configuration diagram of a word line control circuit shown in FIG. 14.

The word line control circuit 204 activates one of the plurality of word lines in response to the row address signal RA. As shown in FIG. 16, the configuration of the word line control circuit 204 corresponds to a configuration excluding the word lines activation control circuit 144 from the word line control circuit 104 shown in FIG. 9. In the word line control circuit 204 shown in FIG. 16, the row decoder 145 receives the row address predecode signals XA0, XA1, . . . , XA7, XB0, XB1, . . . , XB7 from the row predecoder 142.

Bit Line Control Circuit

Figure 17:
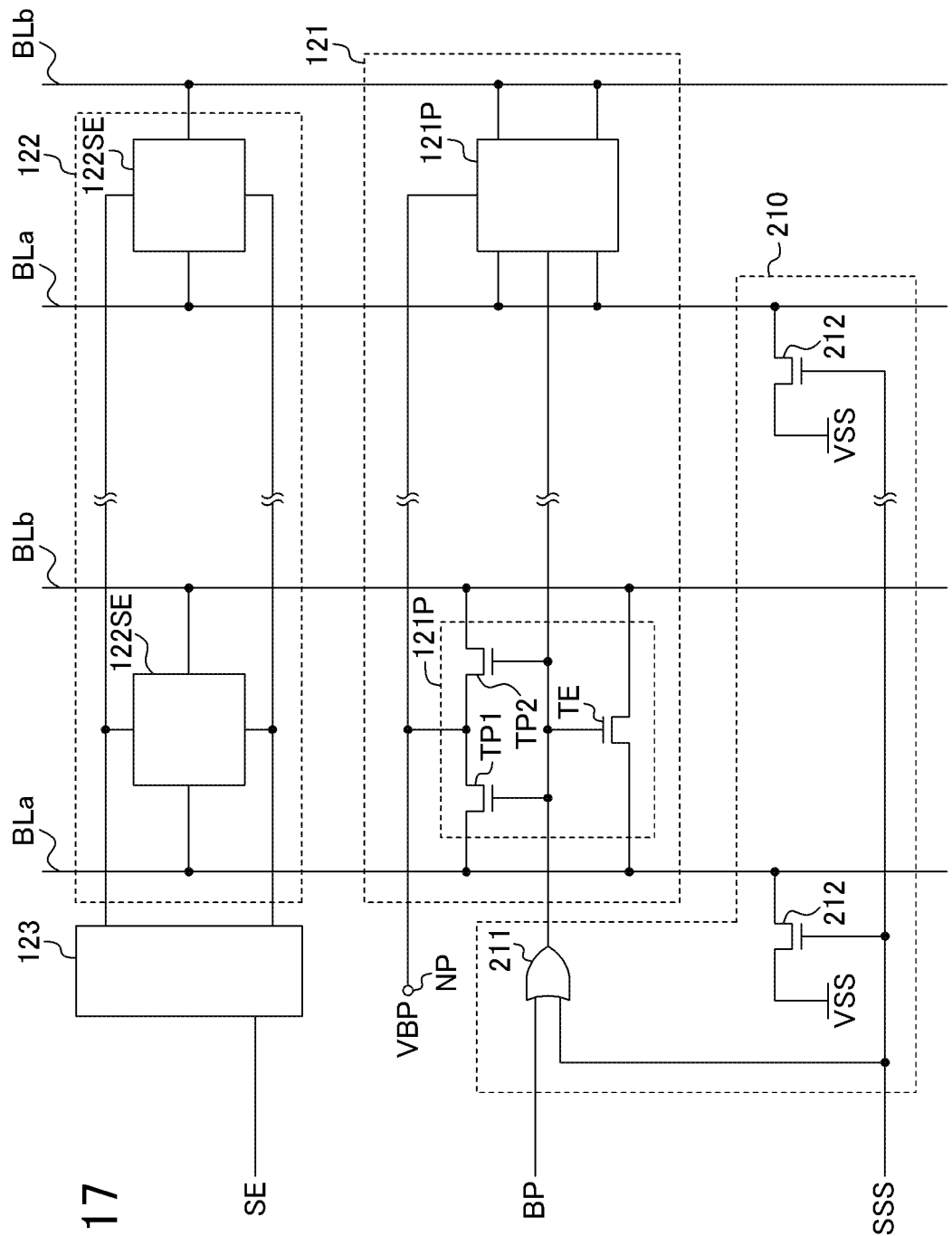
FIG. 17 is a configuration diagram of a bit line control circuit shown in FIG. 14.

FIG. 17 illustrates a configuration of the bit line control circuit 202 shown in FIG. 14. The bit line control circuit 202 includes a drive control circuit 210 in addition to the configuration shown in FIG. 7.

The drive control circuit 210 allows the precharge circuit 121 to couple the bit line pairs BLa, BLb, BLa, BLb, . . . to the precharge node NP, and couples the bit line pairs BLa, BLb, BLa, BLb, . . . to the ground node in response to the heat generation control signal SSS. The drive control circuit 210 includes an OR circuit 211 receiving the precharge signal BP and the heat generation control signal SSS, and transistors 212, 212, . . . corresponding to the bit lines BLa, BLa, . . . , respectively, and coupling their corresponding bit lines BLa, BLa, . . . to the ground node in response to the heat generation control signal SSS.

Operation in Reset Period

Next, operation of the bit line control circuit 202 shown in FIG. 17 in a reset period will be described. Note that, when the memory circuit 21 is in a reset state, the precharge signal BP and the sense amplifier drive signal SE are at a low level, since the logic circuit 22 does not supply the memory control signal (the precharge signal BP and the sense amplifier drive signal SE).

In the reset period after power-on, when the temperature inside the semiconductor integrated circuit 2 (e.g., the temperature of the memory circuit 21) is lower than a predetermined temperature, since the power-on reset signal POR is at a high level, and the sensing signal S13 is also at a high level, the heat generation control circuit 24 puts the heat generation control signal SSS into a high level. This puts an output of the OR circuit 211 in the drive control circuit 210 into a high level, and turns on the equalizing transistor TE, and the precharge transistors TP1 and TP2 in each of the precharge sections 121P, 121P, . . . . The transistors 212, 212, . . . are also turned on.

Since the precharge voltage VBP is set to ½ of the power supply voltage VDD after power-on, a current flows from the precharge node NP to the ground node via the precharge sections 121P, 121P, . . . , and the transistors 212, 212, . . . . This increases the amount of heat generation in the memory circuit 21.

As such, the temperature of the semiconductor integrated circuit 2 can be raised even when the memory circuit 21 is in a reset state, operation of the semiconductor integrated circuit 2 can be rapidly stabilized.

Operation in Standby Period

Next, operation of the bit line control circuit 202 shown in FIG. 17 in a standby period will be described. Note that, when the memory circuit 21 is in a standby state, the precharge signal BP and the sense amplifier drive signal SE are at a low level, since the logic circuit 22 does not supply the memory control signal (the precharge signal BP and the sense amplifier drive signal SE).

When the temperature inside the semiconductor integrated circuit 2 is lower than a predetermined temperature while the memory circuit 21 is a standby state, since the memory activation signal S22 is at a high level, and the sensing signal S13 is also at a high level, the heat generation control circuit 24 puts the heat generation control signal SSS into a high level. As a result, similar to operation in a reset period, the output of the OR circuit 211 in the drive control circuit 210 goes to a high level, thereby allowing currents to flow from the precharge node NP to the ground node via the precharge sections 121P, 121P, . . . , and the transistors 212, 212, . . . . This increases the amount of heat generation in the memory circuit 21.

As such, the temperature of the semiconductor integrated circuit 2 can be raised even when the memory circuit 21 is in a standby state, operation of the semiconductor integrated circuit 2 can be rapidly stabilized. Also, in both of the reset period after power-on and while the memory circuit 11 is in a standby state, the word lines WL, WL, . . . are not activated, and thus, data held in the memory cells MC, MC, . . . is not destroyed.

Note that the heat generation control circuit 24 may operate in response to only the sensing signal S13 from the temperature sensing circuit 13 regardless of the signal level of the power-on reset signal POR, and the signal level of the memory activation signal S22. That is, the heat generation control circuit 24 may put the heat generation control signal S14 into a high level when the sensing signal S13 is at a high level, even when both the power-on reset signal POR and the memory activation signal S22 are at a low level. This configuration also rapidly stabilizes operation of the semiconductor integrated circuit 2, even when the semiconductor integrated circuit 2 is at a low temperature.

The logic circuit 22 and the heat generation control circuit 24 are applicable to the semiconductor integrated circuit 1 shown in FIG. 1. Specifically, the semiconductor integrated circuit 1 may include the logic circuit 22 and the heat generation control circuit 24 shown in FIG. 14 instead of the logic circuit 12 and the heat generation control circuit 14 shown in FIG. 1. This configuration enables a rise in the temperature of the semiconductor integrated circuit 1 even when the memory circuit 11 is in a standby state, thereby rapidly stabilizing operation of the semiconductor integrated circuit 1.

First Variation of Bit Line Control Circuit

Figure 18:
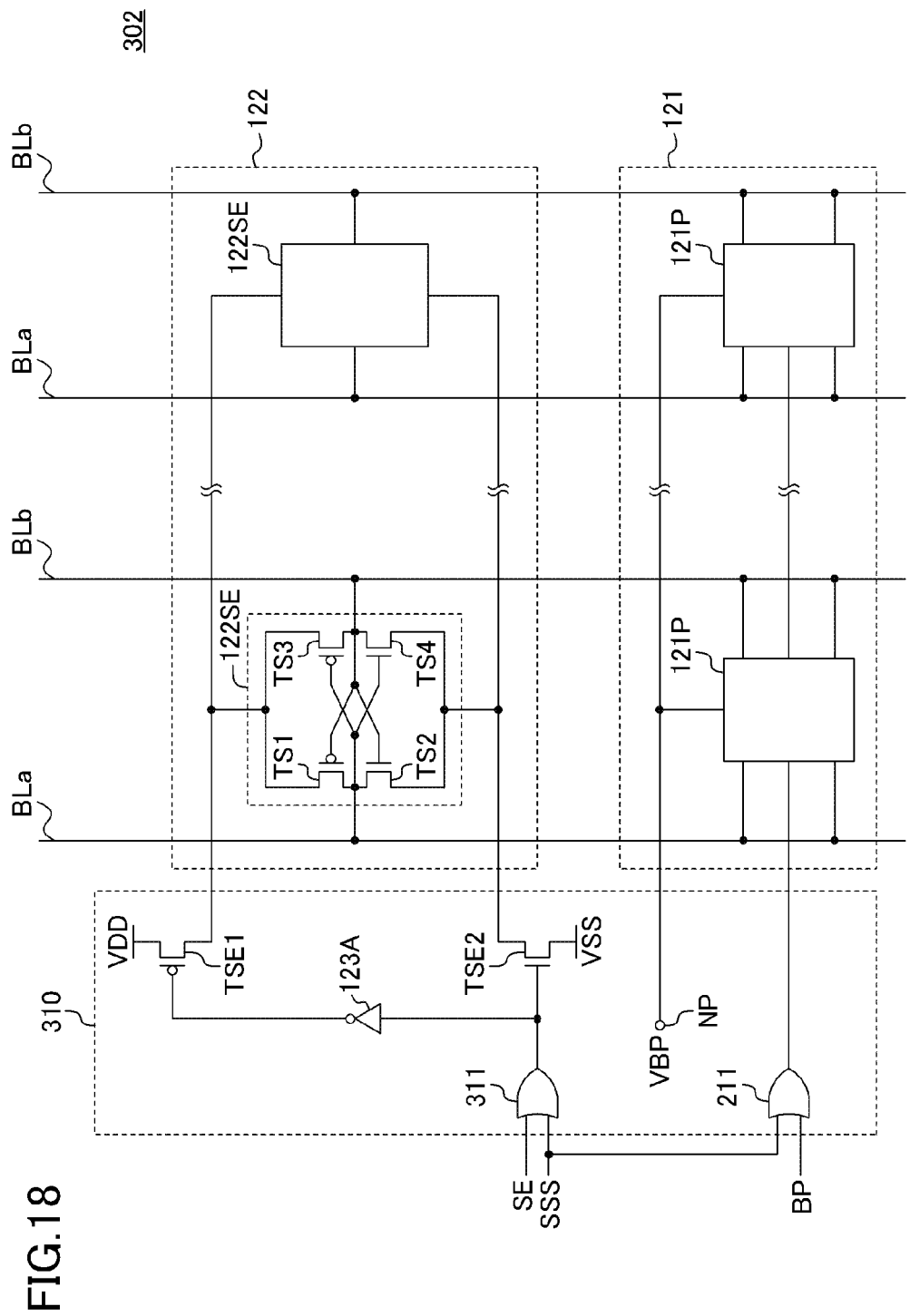
FIG. 18 is a configuration diagram of a first variation of the bit line control circuit shown in FIG. 14.

Note that the memory circuit 21 shown in FIG. 14 may include a bit line control circuit 302 shown in FIG. 18 instead of the bit line control circuit 202. The bit line control circuit 302 shown in FIG. 18 includes a drive control circuit 310 instead of the sense amplifier driving circuit 123 and the drive control circuit 210 shown in FIG. 17. The other configurations are similar to those in FIG. 17.

The drive control circuit 310 allows the sense amplifier circuit 122 to couple the bit line pairs BLa, BLb, BLa, BLb, . . . to the power supply node and the ground node in response to the heat generation control signal SSS. The drive control circuit 310 includes an OR circuit 211, an OR circuit 311 receiving the sense amplifier drive signal SE and the heat generation control signal SSS, an inverter 123A inverting an output of the OR circuit 311, a sense amplifier drive transistor TSE1 switching coupling of the power supply node and the sense amplifiers 122SE, 122SE, . . . in response to an output of the inverter 123A, and a sense amplifier drive transistor TSE2 switching coupling of the ground node and the sense amplifiers 122SE, 122SE, . . . in response to an output of the OR circuit 311.

Operation

When the heat generation control signal SSS is at a high level, an output of the OR circuit 311 in the drive control circuit 310 goes to a high level, and the sense amplifier drive transistors TSE1 and TSE2 are turned on. Potential of each of the bit line pairs BLa, BLb, BLa, BLb, . . . is set to ½ of the power supply voltage VDD after power-on. Thus, the sense amplifier transistors TS1, TS2, TS3, and TS4 are turned on at the sense amplifiers 122SE, 122SE, . . . , respectively, thereby allowing currents to flow from the power supply node to the ground node via the sense amplifiers 122SE, 122SE, . . . , respectively. This increases the amount of heat generation in the memory circuit 21.

Note that the bit line control circuit 302 may further include the drive control circuit 210 shown in FIG. 17 in addition to the configuration shown in FIG. 18.

Second Variation of Bit line Control Circuit

Figure 19:
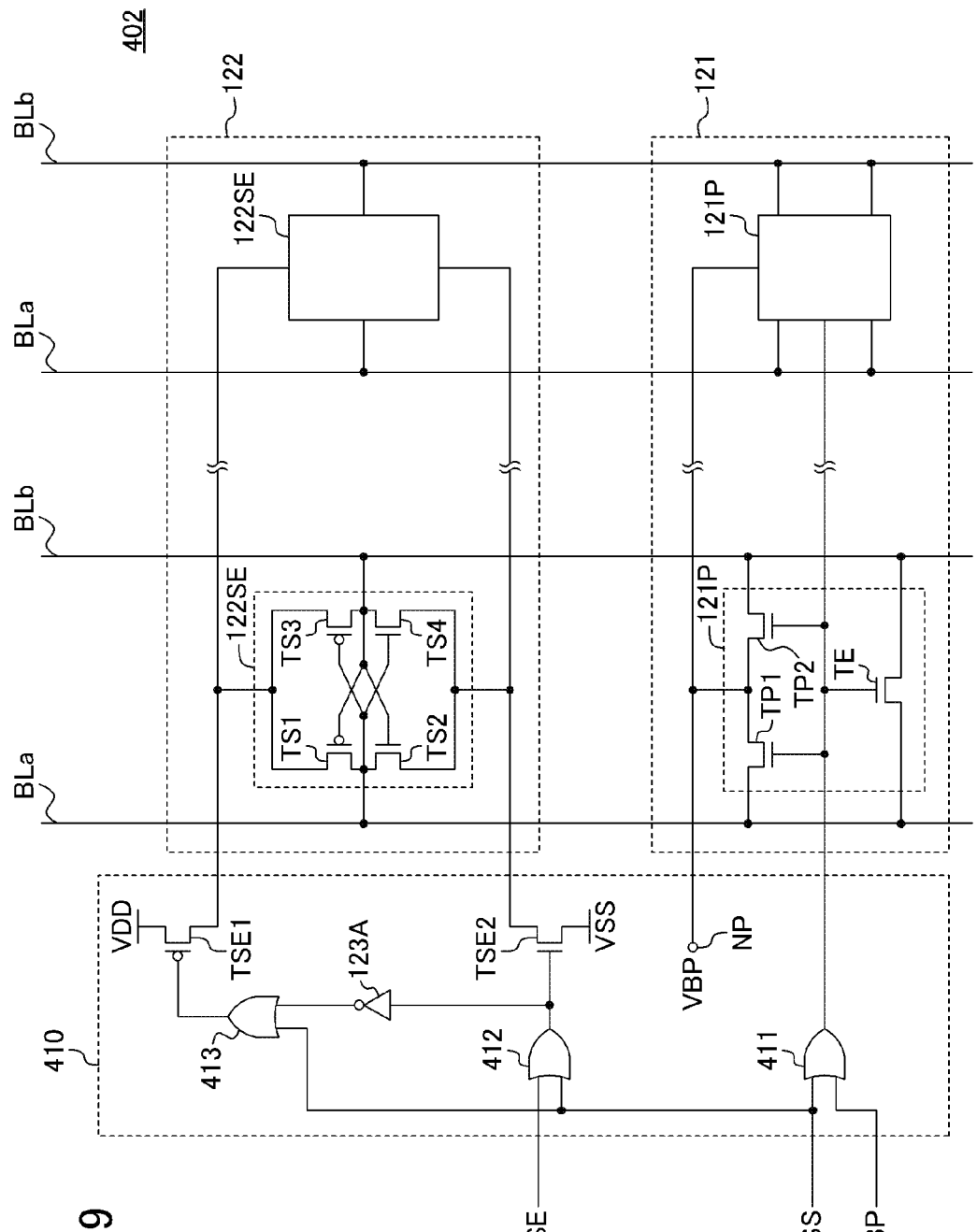
FIG. 19 is a configuration diagram of a second variation of the bit line control circuit shown in FIG. 14.

The memory circuit 21 shown in FIG. 14 may include a bit line control circuit 402 shown in FIG. 19 instead of the bit line control circuit 202. The bit line control circuit 402 shown in FIG. 19 includes a drive control circuit 410 instead of the drive control circuit 210 and the sense amplifier driving circuit 123 shown in FIG. 17.

The drive control circuit 410 allows the precharge circuit 121 to couple the bit line pairs BLa, BLb, BLa, BLb, . . . to the precharge node NP, and the sense amplifier circuit 122 to couple the bit line pairs BLa, BLb, BLa, BLb, . . . to the ground node in response to the heat generation control signal SSS. For example, the drive control circuit 410 includes an OR circuit 411 receiving the precharge signal BP and the heat generation control signal SSS, an OR circuit 412 receiving the sense amplifier drive signal SE and the heat generation control signal SSS, an inverter 123A inverting an output of the OR circuit 412, an OR circuit 413 receiving the heat generation control signal SSS and an output of the inverter 123A, a sense amplifier drive transistor TSE1 switching coupling of the power supply node and the sense amplifiers 122SE, 122SE, . . . in response to an output of the OR circuit 413, and a sense amplifier drive transistor TSE2 switching coupling of the ground node and the sense amplifiers 122SE, 122SE, . . . in response to an output of the OR circuit 412.

Operation

When the heat generation control signal SSS is at a high level, an output of the OR circuit 411 in the drive control circuit 410 goes to a high level, and the equalizing transistor TE, and the precharge transistors TP1 and TP2 are turned on in each of the precharge sections 121P, 121P, . . . . Since the precharge voltage VBP is set to ½ of the power supply voltage VDD after power-on, potential of each of the bit line pairs BLa, BLb, BLa, BLb, . . . is set to ½ of the power supply voltage VDD.

Furthermore, outputs of the OR circuits 412 and 413 of the drive control circuit 410 are at a high level, the sense amplifier drive transistor TSE1 is turned off, and the sense amplifier drive transistor TSE2 is turned on. This turns off the sense amplifier transistors TS1 and TS3, and turns on the sense amplifier transistors TS2 and TS4 in each of the sense amplifiers 122SE, 122SE, . . . .

Therefore, currents flow from the precharge node NP to the ground node via the precharge sections 121P, 121P, . . . , and the sense amplifier transistors TS2 and TS4 of the sense amplifiers 122SE, 122SE, . . . . This increases the amount of heat generation in the memory circuit 21.

Third Variation of Bit Line Control Circuit

Figure 20:
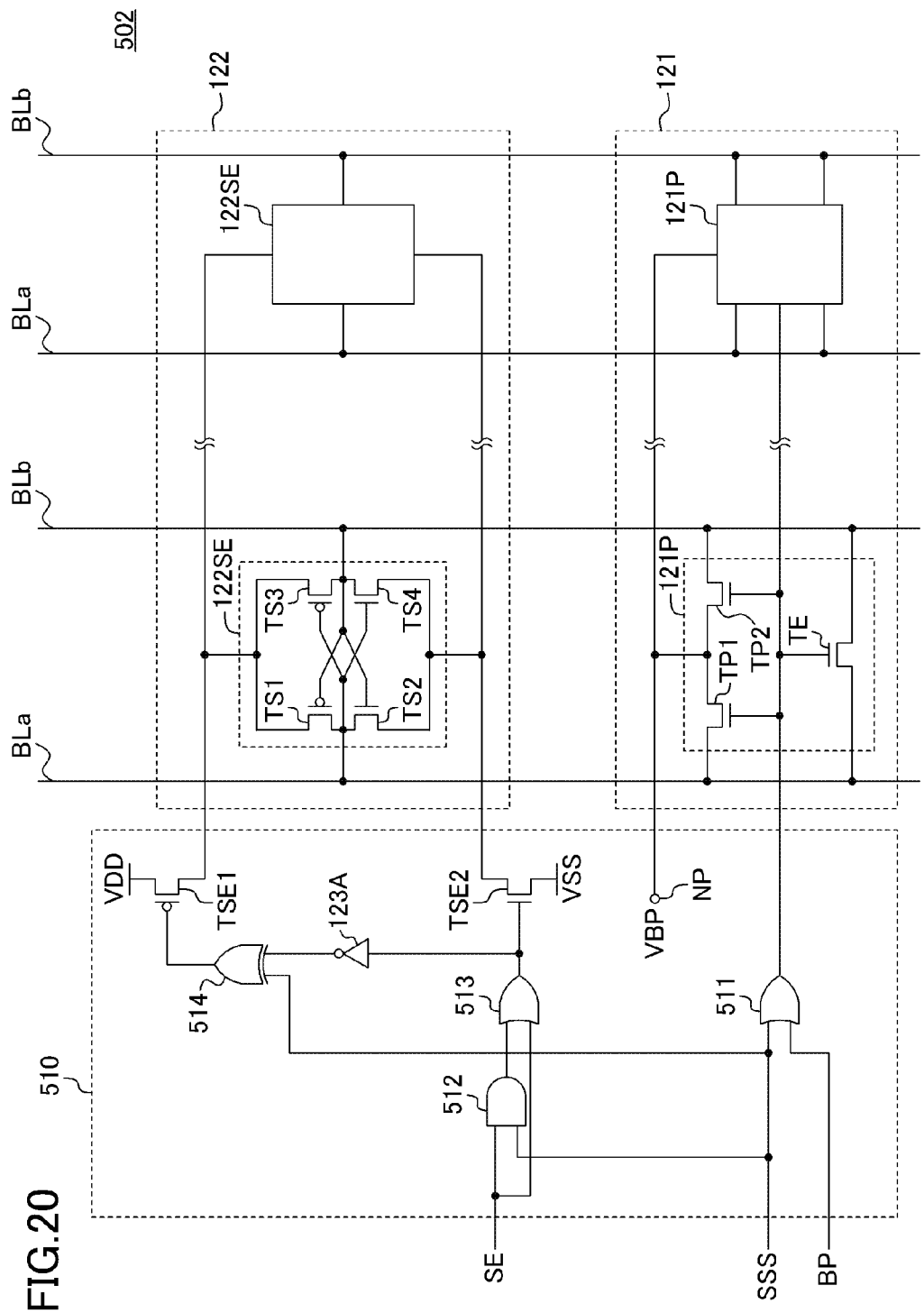
FIG. 20 is a configuration diagram of a third variation of the bit line control circuit shown in FIG. 14.

The memory circuit 21 shown in FIG. 14 may include a bit line control circuit 502 shown in FIG. 20 instead of the bit line control circuit 202. The bit line control circuit 502 shown in FIG. 20 includes a drive control circuit 510 instead of the drive control circuit 210 and the sense amplifier driving circuit 123 shown in FIG. 17.

The drive control circuit 510 allows the precharge circuit 121 to couple the bit line pairs BLa, BLb, BLa, BLb, . . . to the precharge node NP, and the sense amplifier circuit 122 to couple the bit line pairs BLa, BLb, BLa, BLb, . . . to the power supply node in response to the heat generation control signal SSS. For example, the drive control circuit 510 includes an OR circuit 511 receiving the precharge signal BP and the heat generation control signal SSS, an AND circuit 512 receiving the sense amplifier drive signal SE and the heat generation control signal SSS, an OR circuit 513 receiving the sense amplifier drive signal SE and an output of the AND circuit 512, the inverter 123A inverting an output of the OR circuit 513, an XOR circuit 514 receiving the heat generation control signal SSS and an output of the inverter 123A, the sense amplifier drive transistor TSE1 switching coupling of the power supply node and the sense amplifiers 122SE, 122SE, . . . in response to an output of the XOR circuit 514, and the sense amplifier drive transistor TSE2 switching coupling of the ground node and the sense amplifiers 122SE, 122SE, . . . in response to an output of the OR circuit 513.

Operation

When the heat generation control signal SSS is at a high level, an output of the OR circuit 511 in the drive control circuit 510 goes to a high level, and the equalizing transistor TE, and the precharge transistors TP1 and TP2 are turned on in each of the precharge sections 121P, 121P, . . . . Since the precharge voltage VBP is set to ½ of the power supply voltage VDD after power-on, potential of each of the bit line pairs BLa, BLb, BLa, BLb, . . . is set to ½ of the power supply voltage VDD.

Furthermore, outputs of the OR circuit 513 and the XOR circuit 514 of the drive control circuit 510 are at a low level, the sense amplifier drive transistor TSE1 is turned on, and the sense amplifier drive transistor TSE2 is turned off. This turns on the sense amplifier transistors TS1 and TS3, and turns off the sense amplifier transistors TS2 and TS4 in each of the sense amplifiers 122SE, 122SE, . . . .

Therefore, currents flow from the power supply node to the precharge node NP via the sense amplifier transistors TS1 and TS3 of the sense amplifiers 122SE, 122SE, . . . , and the precharge sections 121P, 121P, . . . . This increases the amount of heat generation in the memory circuit 21.

Variation of Memory Cell Array

Figure 21:
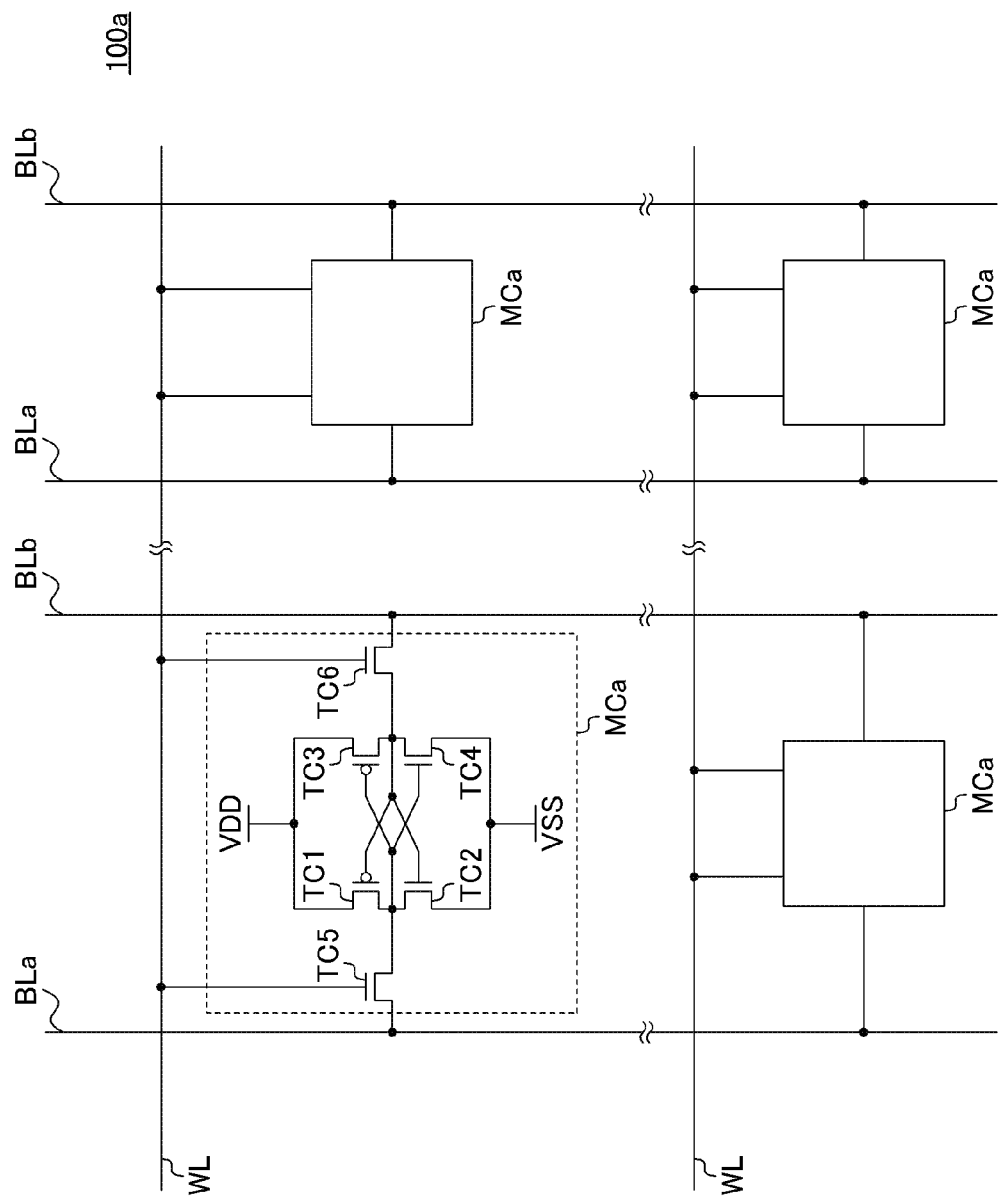
FIG. 21 is a configuration diagram of a variation of the memory cell array shown in FIG. 1.

In the above embodiments, each of the memory circuits 11 and 21 may include a memory cell array 100a shown in FIG. 21 instead of the memory cell array 100. The memory cell array 100a includes memory cells MCa, MCa, . . . instead of the memory cells MC, MC, . . . shown in FIG. 5. Each of the memory cells MCa, MCa, . . . corresponds to any one of word lines WL, WL, . . . , and any one of bit line pairs BLa, BLa, . . . , BLb, BLb, . . . . Each of the memory cells MCa, MCa, . . . includes load transistors TC1 and TC3, drive transistors TC2 and TC4, and access transistors TC5 and TC6.

The load transistor TC1 and the drive transistor TC2 are coupled in series between the power supply node and the ground node to form a first inverter. The load transistor TC3 and the drive transistor TC4 are coupled in series between the power supply node and the ground node to form a second inverter. The first and second inverters are flip-flop coupled. The access transistor TC5 is coupled between its corresponding bit line pair BLa and the output terminal of the first inverter (the connecting point of the load transistor TC1 and the drive transistor TC2), and a gate of the access transistor TC5 is coupled to its corresponding word line WL. The access transistor TC6 is coupled between its corresponding bit line pair BLb and the output terminal of the second inverter (the connecting point of the load transistor TC3 and the drive transistor TC4), and a gate of the access transistor TC6 is coupled to its corresponding word line WL.

That is, each of the memory circuits 11 and 21 may be a dynamic random access memory (DRAM) including the memory cell array 100 shown in FIG. 5, and may be a static random access memory (SRAM) including the memory cell array 100a shown in FIG. 21. In each case, the amount of heat generation in the memory circuit can be increased.

Fourth Variation of Bit Line Control Circuit

Figure 22:
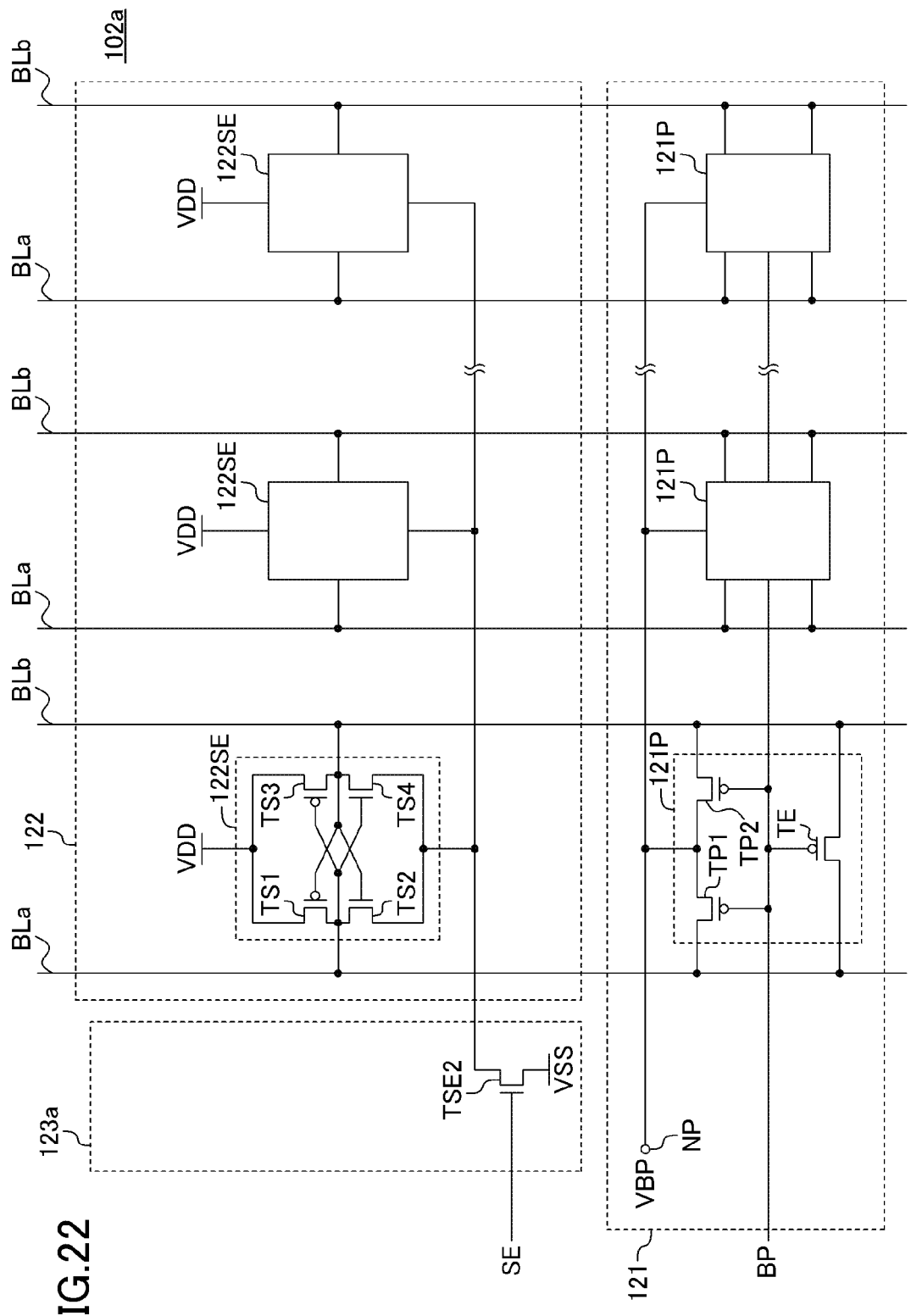
FIG. 22 is a configuration diagram of a fourth variation of the bit line control circuit.

Note that the memory circuit 11 shown in FIG. 1 may include a bit line control circuit 102a shown in FIG. 22 instead of the bit line control circuit 102. The bit line control circuit 102a shown in FIG. 22 includes a sense amplifier driving circuit 123a instead of the sense amplifier driving circuit 123 shown in FIG. 7.

The sense amplifier driving circuit 123a includes a sense amplifier drive transistor TSE2 switching coupling of the ground node and the sense amplifiers 122SE, 122SE, . . . in response to the sense amplifier drive signal SE. In this variation, sources of the sense amplifier transistors TS1 and TS3 are coupled to the power supply node in each of the sense amplifiers 122SE, 1225E, . . . .

With this configuration as well, potential difference between the bit line pairs BLa, BLb, BLa, BLb, . . . can be amplified in response to the sense amplifier drive signal SE.

As shown in FIG. 22, the equalizing transistor TE, and the precharge transistors TP1 and TP2 may be p-MOS transistors in each of the precharge sections 121P, 121P, . . . .

Fifth Variation of Bit Line Control Circuit

Figure 23:
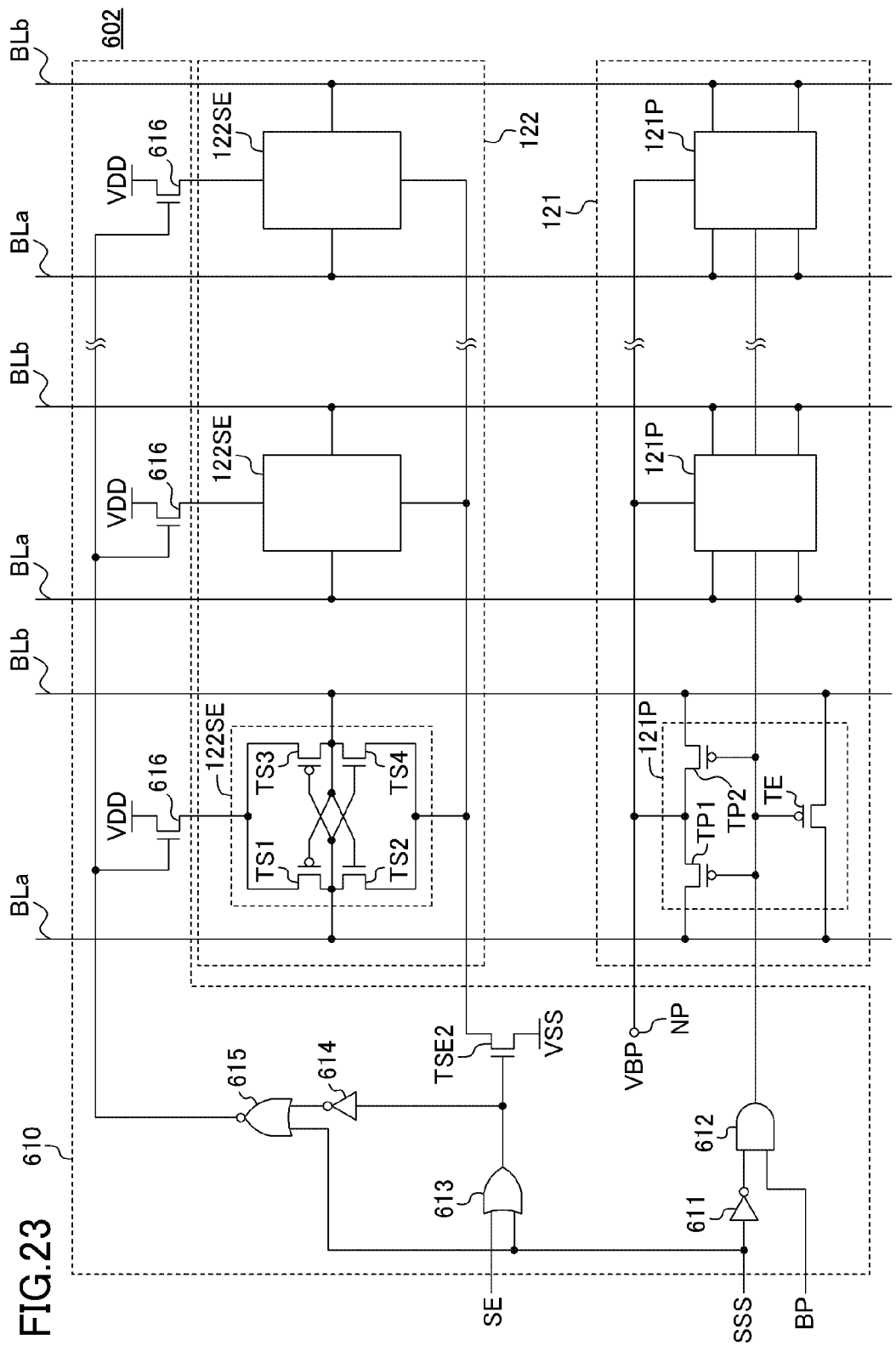
FIG. 23 is a configuration diagram of a fifth variation of the bit line control circuit.

The memory circuit 21 shown in FIG. 14 may include the bit line control circuit 602 shown in FIG. 23 instead of the bit line control circuit 202. The bit line control circuit 602 shown in FIG. 23 includes a drive control circuit 610 instead of the drive control circuit 210 and the sense amplifier driving circuit 123 shown in FIG. 17. Note that in this variation, the equalizing transistor TE, and the precharge transistors TP1 and TP2 are p-MOS transistors in each of the precharge sections 121P, 121P, . . . .

The drive control circuit 610 allows the precharge circuit 121 to couple the bit line pairs BLa, BLb, BLa, BLb, . . . to the precharge node NP, and the sense amplifier circuit 122 to couple the bit line pairs BLa, BLb, BLa, BLb, . . . to the ground node in response to the heat generation control signal SSS. For example, the drive control circuit 610 includes an inverter 611 inverting the heat generation control signal SSS, an AND circuit 612 receiving the precharge signal BP and an output of the inverter 611, an OR circuit 613 receiving the sense amplifier drive signal SE and the heat generation control signal SSS, an inverter 614 inverting an output of the OR circuit 613, a NOR circuit 615 receiving the heat generation control signal SSS and an output of the inverter 614, sense amplifier drive transistors 616, 616, . . . switching coupling of the power supply node and its corresponding sense amplifier 122SE in response to an output of the NOR circuit 615, and the sense amplifier drive transistor TSE2 switching coupling of the ground node and the sense amplifiers 122SE, 122SE, . . . in response to the output of the OR circuit 613.

Operation

When the heat generation control signal SSS is at a high level, an output of the AND circuit 612 in the drive control circuit 610 goes to a low level, and the equalizing transistor TE, and the precharge transistors TP1 and TP2 are turned on in each of the precharge sections 121P, 121P, . . . . The precharge voltage VBP is set to ½ of the power supply voltage VDD after power-on, potential of each of the bit line pairs BLa, BLb, BLa, BLb, . . . is set to ½ of the power supply voltage VDD.

The output of the OR circuit 613 in the drive control circuit 610 goes to a high level, and at the same time, the output of the NOR circuit 615 goes to a low level. The sense amplifier drive transistors 616, 616, . . . are turned off, and at the same time, the sense amplifier drive transistor TSE2 is turned on. This turns off the sense amplifier transistors TS1 and TS3, and turns on the sense amplifier transistors TS2 and TS4 in each of the sense amplifiers 122SE, 1225E, . . . .

Therefore, currents flow from the precharge node NP to the ground node via the precharge sections 121P, 121P, . . . , and the sense amplifier transistors TS1 and TS3 in each of the sense amplifiers 122SE, 122SE, . . . . This increases the amount of heat generation in the memory circuit 21.

Third Embodiment

Figure 24:
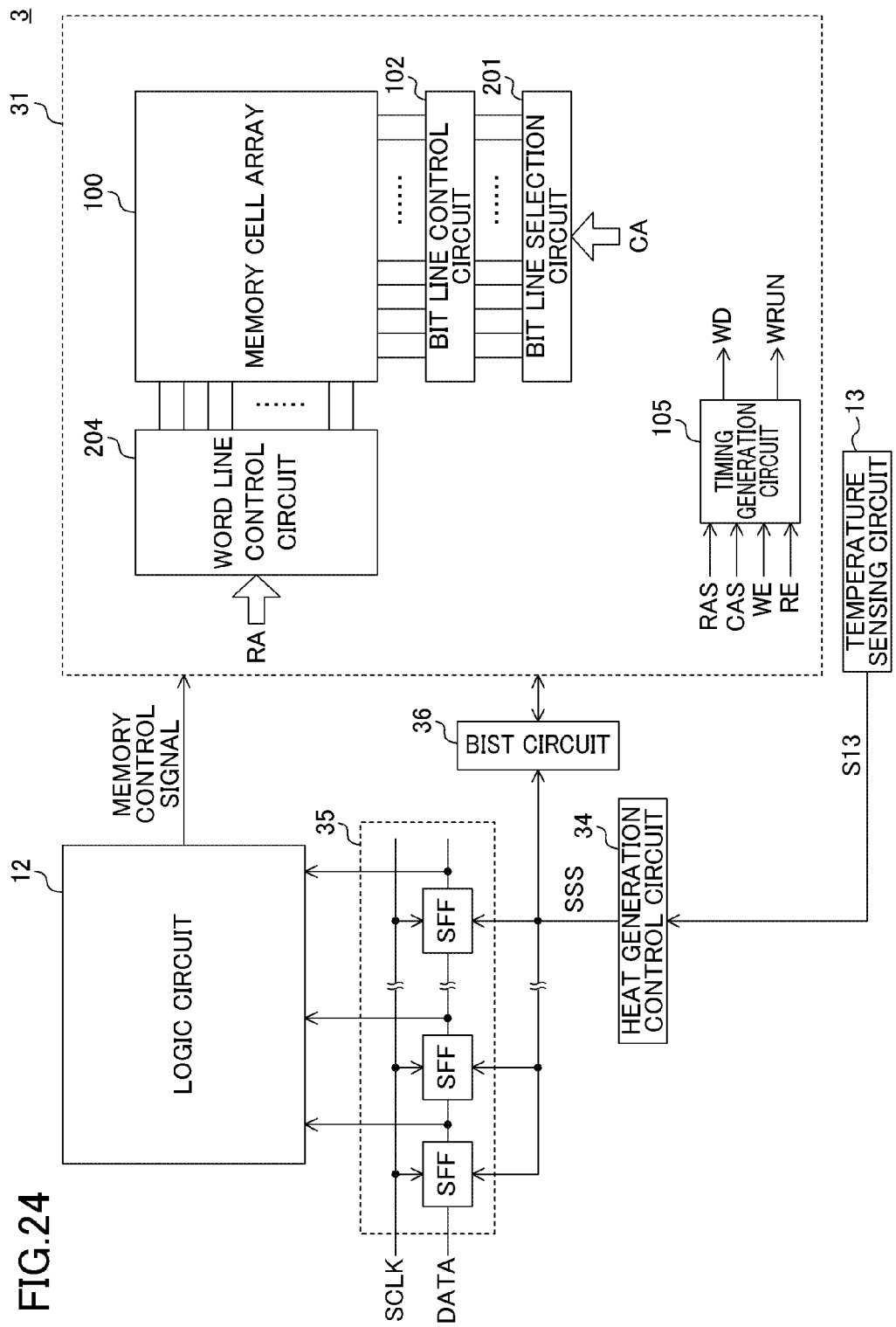
FIG. 24 is a configuration diagram of a semiconductor integrated circuit according to a third embodiment.

FIG. 24 illustrates a configuration of a semiconductor integrated circuit 3 according to a third embodiment. The semiconductor integrated circuit 3 includes a memory circuit 31, a heat generation control circuit 34, a scan chain circuit 35, a BIST circuit 36, and the logic circuit 12 and the temperature sensing circuit 13 shown in FIG. 1.

Heat Generation Control Circuit

The heat generation control circuit 34 put the heat generation control signal SSS into a high level when the sensing signal S13 from the temperature sensing circuit 13 goes to a high level.

Scan Chain Circuit

The scan chain circuit 35 includes a plurality of cascade-coupled scan flip-flops SFF, SFF, . . . . The scan chain circuit 35 (i.e., the scan flip-flops SFF, SFF, . . . ) is set to a shift mode by an external scan mode control signal (not shown). Being set to a shift mode, the scan flip-flop SFF receives and holds set value DATA for observation (or set value DATA for observation held in the scan flip-flop at an earlier stage) in synchronization with a scan clock signal SCLK. As such, the scan chain circuit 35 sequentially shifts the set value DATA for observation in synchronization with the scan clock signal SCLK. Furthermore, the scan chain circuit 35 (i.e., the scan flip-flops SFF, SFF, . . . ) is set to the shift mode, when the heat generation control signal SSS from the heat generation control circuit 34 goes to a high level.

BIST Circuit

The BIST circuit 36 executes self-testing (detection of faults in the memory circuit 31) in response to an external control signal (not shown). For example, the BIST circuit 36 may include a test pattern generation circuit outputting a test pattern to the memory circuit 31 in response to the external control signal, and an expected value comparison circuit comparing a testing result (i.e., an output value of the memory circuit 31) and an expected value. Furthermore, the BIST circuit 36 executes self-testing when the heat generation control signal SSS from the heat generation control circuit 34 goes to a high level.

Operation

When the temperature inside the semiconductor integrated circuit 3 is lower than a predetermined temperature, the temperature sensing circuit 13 puts the sensing signal S13 into a high level, and the heat generation control circuit 34 puts the heat generation control signal SSS into a high level. Thus, the scan chain circuit 35 sequentially shifts the set value DATA for observation in synchronization with the scan clock signal SCLK, and the BIST circuit 36 executes self-testing. In accordance with the shift operation of the scan chain circuit 35, a current flows to the scan chain circuit 35 and the logic circuit 12. In accordance with the self-testing of the BIST circuit 36, a current flows to the BIST circuit 36 and the memory circuit 31. This results in a rise in the temperature inside the semiconductor integrated circuit 3.

As described above, since the temperature inside the semiconductor integrated circuit 3 rises by driving the scan chain circuit 35 and the BIST circuit 36, operation of the semiconductor integrated circuit 3 can be rapidly stabilized even when the semiconductor integrated circuit 3 is at a low temperature.

Note that the semiconductor integrated circuit 3 may exclude either one of the scan chain circuit 35 or the BIST circuit 36.

Similar to the heat generation control circuit 14 shown in FIG. 1, the heat generation control circuit 34 may put the heat generation control signal SSS into a high level, when the sensing signal S13 from the temperature sensing circuit 13 goes to a high level while the memory circuit 11 is in a reset state (i.e., while the power-on reset signal POR is at a high level). This configuration enables a rise in the temperature of the semiconductor integrated circuit 3 even when the memory circuit 31 is in a reset state, thereby rapidly stabilizing operation of the semiconductor integrated circuit 3.

Alternately, the semiconductor integrated circuit 3 may include the logic circuit 22 shown in FIG. 14 instead of the logic circuit 12. In this case, similar to the heat generation control circuit 24 shown in FIG. 14, the heat generation control circuit 34 may put the heat generation control signal SSS into a high level, when the sensing signal S13 from the temperature sensing circuit 13 goes to a high level while the memory circuit 31 is in a standby state (i.e., while the memory activation signal S22 is at a high level). This configuration enables a rise in the temperature of the semiconductor integrated circuit 3 even when the memory circuit 31 is in a standby state, thereby rapidly stabilizing operation of the semiconductor integrated circuit 3.

The scan chain circuit 35 and the BIST circuit 36 are applicable to the semiconductor integrated circuits 1 and 2 shown in FIGS. 1 and 14. That is, each of the semiconductor integrated circuits 1 and 2 may further include the scan chain circuit 35 and the BIST circuit 36 shown in FIG. 24 in addition to the configurations shown in FIGS. 1 and 14.

Number of Memory Circuit

Note that, in the above-described embodiments, the semiconductor integrated circuits may include a plurality of memory circuits. That is, a plurality of memory circuits may be provided for a single logic circuit on a same semiconductor substrate.

Estimation of Temperature Rise

Next, referring to FIGS. 25 and 26, the relationship between a temperature rise and time in the semiconductor integrated circuit shown in FIG. 1 will be described.

Figure 25:
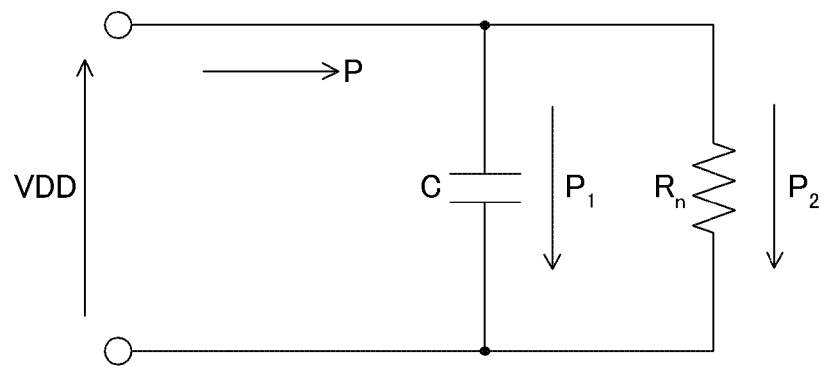
FIG. 25 illustrates an electrical equivalent circuit focusing on heat flow in a semiconductor integrated circuit.

FIG. 25 illustrates an electrical equivalent circuit focusing on flow of heat (heat flow) in a semiconductor integrated circuit. When all the heat flow applied to the semiconductor integrated circuit leaks outside, a rise in the temperature of the semiconductor integrated circuit stops. This temperature is referred to as a "saturation temperature."

As shown in FIG. 25, the semiconductor integrated circuit can be expressed by an integration circuit including a heat resistor Rn and a heat capacitor C. A voltage is applied to the circuit. Where heat flow is "P," heat flow absorbed by the semiconductor integrated circuit itself is "P1," heat flow leaking outside due to a temperature rise is "P2," a temperature rise is "θ," a saturation temperature is "θ1," the applied voltage is "VDD," and an operating current is "I;" the following equations 20 and 21 are obtained.

$$P = P1 + P2 \quad (20)$$

$$\theta = (\int P1 \cdot dt)/C = Rn \cdot P2 \quad (21)$$

Figure 26:
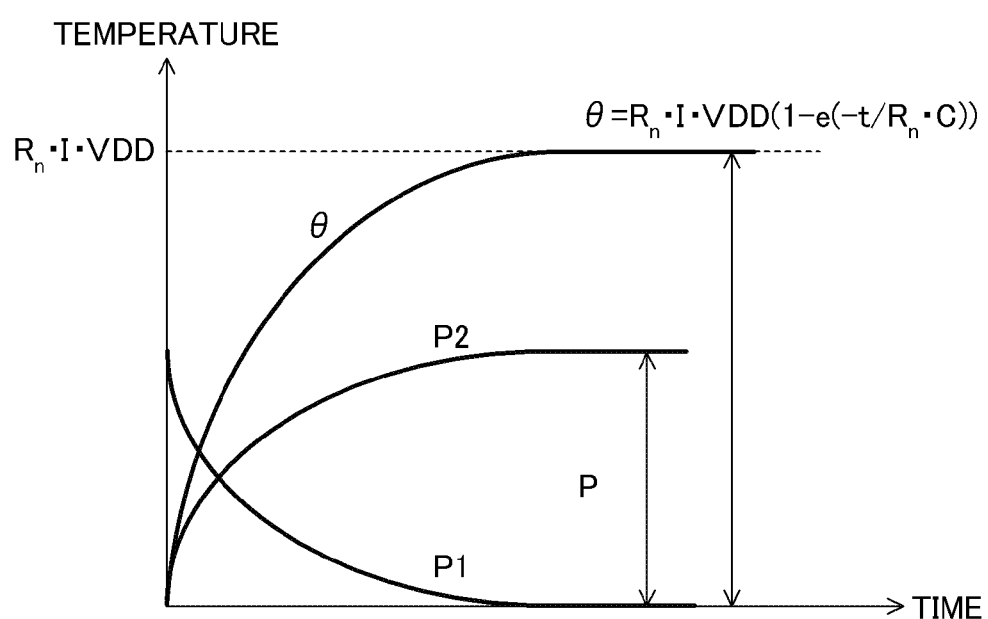
FIG. 26 is a graph illustrating characteristics of the electrical equivalent circuit shown in FIG. 25.

When a transient value to the saturation temperature is obtained from the equations 20 and 21 based on transient theory, the following equation 22 is obtained (see FIG. 26).

$$\theta = Rn \cdot P(1 - e(-t/Rn \cdot C)) \quad (22)$$

Since P=I·VDD, the following 22 is expressed by the following equation 23.

$$\theta = Rn \cdot I \cdot VDD(1 - e(-t/Rn \cdot C)) \quad (23)$$

Therefore, the saturation temperature is expressed by the following equation 24.

$$\theta 1 = Rn \cdot I \cdot VDD \quad (24)$$

When the equations 23 and 24 are transformed with respect to "t," the following equation 25 is obtained.

$$t = Rn \cdot C \cdot \ln(\theta 1 (\theta 1/(\theta 1 - \theta))) \quad (25)$$

The semiconductor integrated circuit includes 64 memory circuits, each of which includes 256 word lines in a memory cell array. When a word line control circuit activates 64 of the 256 word lines at a time in test operation. That is, 4096 (=64×64) word lines are activated at the same time in the semiconductor integrated circuit. Assume that parasitic capacitance of a single word line is "1 pF." In this case, the total parasitic capacitance Cw is expressed by the following equation 26.

$$Cw = 1 \text{ pF} \times 4096 = 4096 \text{ pF} \quad (26)$$

Where a duty cycle is "Tc," an applied voltage is "VDD," and a charge amount is "Q;" an operating current I is expressed by the following equation 27.

$$I = dQ/dTc = Cw \times VDD/Tc \quad (27)$$

Where Tc=50 ns and VDD=3.3 V, an operating current I is expressed as follows.

$$I = 4096 \times 10^{-12} \times 3.3/50 \times 10^{-9} \approx 270.3 \text{ mA}$$

The saturation temperature θ1 and the time t until the temperature reaches the saturation temperature θ1 (the time until the temperature reaches 90% of the saturation temperature) is calculated from the equations 24 and 25. Where heat resistance of a package is 50° C./W, specific heat capacity is 700 J/(kg·K), and a chip mass is 1×10⁻⁶ kg, the saturation temperature θ1 and the time t are calculated as follows.

$$\theta 1 = Rn \cdot I \cdot VDD = 60 \times 0.2703 \times 3.3 \doteq 53.5°C$$

$$\theta 1 = Rn \cdot C \cdot \ln(\theta 1/(\theta 1 - \theta)))$$
$$= 50 \times 700 \times 1 \times 10^{-6} \times \ln(53.5/(53.5 - 48.15))$$
$$= 0.035 \times 1.68$$
$$\doteq 70.6 \text{ ms}$$

That is, where test operation is executed with the power supply voltage of 3.3 V and a duty cycle of 50 ns, a current of 270.3 mA flows and the saturation temperature is 53.5° C., and the time until the temperature reaches 90% of the saturation temperature is 70.6 ms. As such, it is found that in test operation, many currents flow to generate heat as compared to normal operation, thereby rapidly raising the temperature of the chip.

The semiconductor integrated circuit according to the present disclosure is useful for realizing a wide range of operating temperature for maintaining high reliability in an on-vehicle semiconductor.

Note that the above embodiments are intrinsically preferred examples, and it is not intended that the embodiments limit the present disclosure, its application, and the range of the application.

What is claimed is:

1. A semiconductor integrated circuit to which a predetermined reset signal is supplied after start of power supply, the semiconductor integrated circuit comprising:
 a memory circuit;
 a logic circuit configured to output a memory control signal controlling operation of the memory circuit;
 a temperature sensing circuit configured to activate a sensing signal when sensing that a temperature inside the semiconductor integrated circuit is lower than a predetermined temperature; and
 a heat generation control circuit configured to activate a heat generation control signal when the sensing signal is activated while the reset signal is supplied, wherein
 a current is generated inside the memory circuit to raise the temperature inside the semiconductor integrated circuit when the heat generation control signal is activated.

2. A semiconductor integrated circuit comprising:
 a memory circuit being changeable between a standby state and an operating state;
 a logic circuit configured to control a state of the memory circuit;
 a temperature sensing circuit configured to activate a sensing signal when sensing that a temperature inside the semiconductor integrated circuit is lower than a predetermined temperature; and
 a heat generation control circuit configured to activate a heat generation control signal when the sensing signal is activated while the logic circuit controls the memory circuit to the standby state; wherein
 a current is generated inside the memory circuit to raise the temperature inside the semiconductor integrated circuit when the heat generation control signal is activated.

3. A semiconductor integrated circuit to which a predetermined reset signal is supplied after start of power supply, the semiconductor integrated circuit comprising:
 a memory circuit being changeable between a standby state and an operating state;
 a logic circuit configured to control a state of the memory circuit;
 a temperature sensing circuit configured to activate a sensing signal when sensing that a temperature inside the semiconductor integrated circuit is lower than a predetermined temperature; and
 a heat generation control circuit configured to activate a heat generation control signal when the sensing signal is activated while the reset signal is supplied, or while the logic circuit controls the memory circuit to the standby state, wherein
 a current is generated inside the memory circuit to raise the temperature inside the semiconductor integrated circuit when the heat generation control signal is activated.

4. The semiconductor integrated circuit of claim 1, wherein the memory circuit includes
 a memory cell array including a plurality of word lines and a plurality of bit line pairs intersecting each other, and a plurality of memory cells formed at intersections between the plurality of word lines and the plurality of bit line pairs,
 a bit line selection circuit configured to select any one of the bit line pairs,
 a drive control circuit configured to activate a drive signal in response to the memory control signal and the heat generation control signal, and
 a word line control circuit being switchable between a normal mode and a heat generation mode in accordance with a test mode signal, being driven in response to the drive signal from the drive control circuit, being configured to activate one of the plurality of word lines in response to the memory control signal when driven in the normal mode, and being configured to activate two or more of the plurality of word lines when driven in the heat generation mode.

5. The semiconductor integrated circuit of claim 4, wherein the bit line selection circuit is switchable between a normal mode and a heat generation mode in accordance with the test mode signal, is configured to select one of the plurality of bit line pairs in the normal mode, and is configured to select two or more of the plurality of bit line pairs in the heat generation mode.

6. The semiconductor integrated circuit of claim 1, wherein the memory circuit includes
 a first node to which a first voltage is supplied, and
 a second node to which a second voltage lower than the first voltage is supplied, and
 a current is generated from the first node to the second node to raise the temperature inside the semiconductor integrated circuit when the heat generation control signal is activated.

7. The semiconductor integrated circuit of claim 6, wherein the first voltage is a voltage for precharging the bit line pair, the memory circuit includes
 a plurality of bit line pairs, and
 a precharge circuit configured to precharge each of the plurality of bit line pairs by coupling each of the plurality of bit line pairs to the first node, and
 a current is generated from the first node to the second node via the precharge circuit to raise the temperature inside the semiconductor integrated circuit when the heat generation control signal is activated.

8. The semiconductor integrated circuit of claim 6, wherein the memory circuit includes
 a plurality of bit line pairs, and
 a sense amplifier circuit configured to amplify a potential difference in each of the plurality of bit line pairs to a difference between the first voltage and the second voltage by coupling each of the plurality of bit line pairs to the first node and the second node, and
 a current is generated from the first node to the second node via the sense amplifier circuit to raise the temperature inside the semiconductor integrated circuit when the heat generation control signal is activated.

9. The semiconductor integrated circuit of claim 6, wherein the memory circuit includes
 a plurality of bit line pairs,
 a third node to which a precharge voltage lower than the first voltage and higher than the second voltage is supplied,
 a precharge circuit configured to precharge each of the plurality of bit line pairs by coupling each of the plurality of bit line pairs to the third node, and
 a sense amplifier circuit configured to amplify a potential difference in each of the plurality of bit line pairs to a difference between the first voltage and the second voltage by coupling each of the plurality of bit line pairs to the first node and the second node, and
 a current is generated from the third node to the second node via the precharge circuit and the sense amplifier circuit to raise the temperature inside the semiconductor integrated circuit when the heat generation control signal is activated.

10. The semiconductor integrated circuit of claim 6, wherein the memory circuit includes
a plurality of bit line pairs,
a third node to which a precharge voltage lower than the first voltage and higher than the second voltage is supplied,
a precharge circuit configured to precharge each of the plurality of bit line pairs by coupling each of the plurality of bit line pairs to the third node, and
a sense amplifier circuit configured to amplify a potential difference in each of the plurality of bit line pairs to a difference between the first voltage and the second voltage by coupling each of the plurality of bit line pairs to the first node and the second node, and
a current is generated from the first node to the third node via the precharge circuit and the sense amplifier circuit to raise the temperature inside the semiconductor integrated circuit when the heat generation control signal is activated.

11. The semiconductor integrated circuit of claim 1, wherein
a scan flip-flop is controlled to a shift mode to raise the temperature inside the semiconductor integrated circuit when the heat generation control signal is activated.

12. The semiconductor integrated circuit of claim 1, further comprising:

a scan chain circuit controlled by the heat generation control signal; and
a BIST circuit controlled by the heat generation control signal.

13. A semiconductor integrated circuit to which a predetermined reset signal is supplied after start of power supply, the circuit comprising:
a memory circuit being changeable between a standby state and an operating state;
a logic circuit configured to control a state of the memory circuit; and
a temperature sensing circuit configured to activate a sensing signal when sensing that a temperature inside the semiconductor integrated circuit is lower than a predetermined temperature, wherein
an operating current increases when the sensing signal is activated while the reset signal is supplied, or while the logic circuit controls the memory circuit to the standby state.

14. The semiconductor integrated circuit of claim 1, wherein
the memory circuit is a dynamic random access memory.

15. The semiconductor integrated circuit of claim 1, wherein
the memory circuit is a static random access memory.

* * * * *